US009268894B2

(12) United States Patent
Sharma et al.

(10) Patent No.: US 9,268,894 B2
(45) Date of Patent: Feb. 23, 2016

(54) AREA OPTIMIZED DRIVER LAYOUT

(71) Applicant: STMicroelectronics International N.V., Amsterdam (NL)

(72) Inventors: Vishal Kumar Sharma, Delhi (IN); Manoj Sharma Kumar, Greater Noida (IN)

(73) Assignee: STMICROELECTRONICS INTERNATIONAL N.V., Amsterdam (NL)

( * ) Notice: Subject to any disclaimer, the term of this patent is extended or adjusted under 35 U.S.C. 154(b) by 0 days.

(21) Appl. No.: 14/279,587

(22) Filed: May 16, 2014

(65) Prior Publication Data

US 2015/0331985 A1 Nov. 19, 2015

(51) Int. Cl.
*G06F 17/50* (2006.01)

(52) U.S. Cl.
CPC ........ *G06F 17/5072* (2013.01); *G06F 17/5077* (2013.01)

(58) Field of Classification Search
CPC ............ G06F 17/5072; G06F 17/5077; G06F 17/5068; G06F 17/505; H01L 27/0266; H01L 27/0288
See application file for complete search history.

(56) References Cited

U.S. PATENT DOCUMENTS

| 6,550,047 B1* | 4/2003 | Becker .......................... 716/122 |
| 8,302,060 B2* | 10/2012 | Chiang et al. ................. 716/126 |
| 2004/0268284 A1* | 12/2004 | Perez et al. ..................... 716/11 |
| 2007/0152712 A1* | 7/2007 | Jun ................................ 326/83 |
| 2010/0232079 A1* | 9/2010 | Wu et al. .......................... 361/56 |
| 2012/0124531 A1* | 5/2012 | Chiang et al. .................. 716/55 |
| 2013/0234756 A1* | 9/2013 | Rebeor et al. .................. 326/37 |

* cited by examiner

*Primary Examiner* — Nha Nguyen
(74) *Attorney, Agent, or Firm* — Slater & Matsil, L.L.P.

(57) ABSTRACT

A computerized method for designing a layout of a driver includes analyzing a schematic circuit. PMOSFETs coupled between first common nodes are grouped into one or more first classes. NMOSFETs coupled between second common nodes are grouped into one or more second classes. The method further includes generating the layout for each MOSFET at each location in a layout area of the driver by generating a super parameterized cell (PCELL) layout block comprising a master MOSFET PCELL and a master guard ring PCELL for each of the first class and the second class. The master MOSFET PCELL includes a first set of parameters for the MOSFET and the master guard ring PCELL includes a second set of parameters for the guard ring around the MOSFET. A child PCELL of the master MOSFET PCELL and the master guard ring PCELL are instantiated at each location in the layout area.

39 Claims, 24 Drawing Sheets

| PCELL PARAMETERS | |
|---|---|
| 1 | Circuit/functional Level Parameters |
| 2 | DFM Parameters |
| 3 | ESD Parameters |
| 4 | EM Parameters |

*Fig. 6A*

| | PCELL PARAMETER NAME | DESCRIPTION |
|---|---|---|
| 1 | Number of Fingers | Number of MOSFET (PMOS/NMOS) fingers to be enclosed inside the well (nwell/pwell). |
| 2 | MOS Library name | The library name from which the PCELL of the MOSFET is referring. |
| 3 | MOS Name | Name of the MOSFET used inside the PCELL of the IO DRIVER. |
| 4 | View name of the MOSFET | The viewname of the MOSFET used inside the PCELL of the IO DRIVER. |
| 5 | Total number of MOSFET | The total MOSFETs used inside the PCELL of the IO DRIVER. |
| 6 | Total number of MOSFET rows | Number of rows required to design the IO DRIVER. |
| 7 | Number of MOSFETs per row | List which defines the number of MOSFET in every row, the number of MOSFET in different row can be different. |
| 8 | Region with no silicidation on source | The region where no silicidation will be performed on the source diffusion of the MOSFET. |
| 9 | Region with no silicidation on drain | The region where no silicidation will be performed on the drain diffusion of the MOSFET. |
| 10 | Alternate MOSFETs Orientation | Defines whether the alternate MOSFET in the PCELL for the IO DRIVER can be oriented in same rotation or the alternate MOSFET is oriented such that source/drain terminal or common active region of adjacent MOSFET face each other. |
| 11 | Starting terminal of PCELL | Defines whether starting terminal of the PCELL is drain or source, this allows whether the drain terminal of the MOSFET will face the enclosing well or not in case of even number of fingers of MOSFET enclosed inside the well guard ring. |
| 12 | Alignment of MOSFETs | Defines whether all the MOSFET inside the PCELL are top aligned or bottom aligned. |
| 13 | Row spacing of MOSFETs | Defines the spacing between the MOSFETs in two different rows. |
| 14 | Spacing of MOSFETS in row | Defines the spacing between the adjacent MOSFET's in same row. |

| | | |
|---|---|---|
| 15 | MOSFET to well spacing in x-direction | Defines the spacing between the MOSFET and the enclosing well guarding in the x-direction for both the edges of the well guard ring in the left and/or in right side of the MOSFET. |
| 16 | MOSFET to well spacing in y-direction | MOSFET to well spacing in +y-direction |
| 17 | MOSFET to well spacing in same row | MOSFET to well spacing in -y-direction |
| 18 | Sequence of all MOSFETs | Defines the sequence for all the MOSFET (connected between same source and drain node but the gate node could be same or different) which is the member of the particular PCELL. The list contains the name of all the MOSFET connected between same source and drain node but the gate node could be same or different. |
| 19 | Finger width of MOSFETs | Defines the finger width of corresponding MOSFET mentioned in the sequence list of MOS (PMOS/NMOS) parameter of the PCELL. |
| 20 | Number of Fingers | Defines the number of fingers required for the corresponding MOSFET mentioned in the sequence list of MOS (PMOS/NMOS) parameter of the PCELL. |
| 21 | Finger length | Defines the finger length of corresponding MOSFET mentioned in the sequence list of MOS (PMOS/NMOS) parameter of the PCELL. |
| 22 | Well doping type | Defines whether the well enclosing the MOSFET is the nwell or pwell in that particular PCELL. |
| 23 | MOSFET enclosure | Defines whether designer wants to enclose the MOSFET inside the well or not in that particular PCELL. |
| 24 | Vertical location of well guarding | Defines whether the well guarding in between MOSFET in vertical direction is required or not, in the particular PCELL. |
| 25 | Width of well guarding | Defines the width of the well guarding of the particular PCELL. |
| 26 | Number of contacts on vertical well guarding (top) | Defines whether the contacts from the well guarding enclosing the MOSFET is reduced (starting from top) from all the vertical guardings in the particular PCELL. The value of this parameter is in terms of distance in which no contact may be placed or in number of contacts to be removed from top side. |

*Fig. 6B*

| | | |
|---|---|---|
| 27 | Number of contacts on vertical well guardring (bottom) | Defines whether the contacts from the well guardring enclosing the MOSFET is reduced (starting from bottom) from all the vertical guardrings in the particular PCELL. The value of this parameter is in terms of distance in which no contact may be placed or in number of contacts to be removed from bottom side. |
| 28 | Metal layer width (top) | Defines whether the metal layer from the well guardring enclosing the MOSFET is reduced (starting from top) from in all the vertical guardrings in the particular PCELL. The value of this parameter is in terms of distance, i.e., there is no metal over the guard ring up to a particular distance from top. |
| 29 | Metal layer width (bottom) | Defines whether the metal layer from the well guardring enclosing the MOSFET is reduced (starting from bottom) from all the vertical guardrings in the particular PCELL. The value of this parameter is in terms of distance, i.e., there is no metal over the guard ring up to a particular distance from bottom. |
| 30 | Adjacent MOSFET spacing | Defines the spacing between the adjacent MOSFET of different finger width in the particular PCELL. |
| 31 | Metal layer name | Defines the metal layer used in the well guardring enclosing the MOSFET in the particular PCELL. |

*Fig. 6C*

| | PCELL PARAMETER NAME | DESCRIPTION |
|---|---|---|
| 1 | Number of Fingers | Number of MOSFET (PMOS/NMOS) fingers to be enclosed inside the well (nwell/pwell). |
| 2 | Guard ring space | Value used to maintain the connection symmetry between the two adjacent MOS with well guard-ring strap in between them. its value is equal to the width of well guard-ring strap |
| 3 | Guard ring metal one width | Width of Metal1 used for well guard-ring connection |
| 4 | Source/drain spacing | Spacing between the Source and Drain connection |
| 5 | List of metal one height | A list comprising Metal1 height for Source/Drain connection of a MOS in different rows. Metal1 height is the same for all the MOS in a single row. Example : list( m1hrow1 m1hrow2 ...... m1hrown ) |
| 6 | List of metal one spacing | A list defining the spacing of Metal1 used for Source/Drain connection of a MOS between different rows. Example : list( m1spacerow12 m1hrow2 3 ...... mhrownn ) |
| 7 | Source connection metal width | Metal2 to Metal4 width used for Source connection of all the MOS except extreme left or extreme right connection |
| 8 | Source connection metal height | Metal2 to Metal4 height used for Source connection of all the MOS except extreme left or extreme right connection. |
| 9 | Drain connection metal width | Metal2 to Metal4 width used for Drain connection of all the MOS except extreme left or extreme right connection |
| 10 | Drain connection metal height | Metal2 to Metal4 height used for Drain connection of all the MOS except extreme left or extreme right connection |
| 11 | Source connection width increment | Width of Metal1 used for Source connection of all the MOS to be aligned with Metal2 to Metal4 |
| 12 | Drain connection width increment | Width of Metal1 used for Drain connection of all the MOS to be aligned with Metal2-Metal4 |
| 13 | First metal width | Width of extreme left metal2 to metal4. This value may be independent of whether the terminal is source or drain |

*Fig. 6D*

| 14 | First metal height | Height of extreme left metal2 to metal4. This value may be independent of whether the terminal is source or drain |
| --- | --- | --- |
| 15 | Last metal width | Width of extreme right metal2 to metal4. This value may be independent of whether the terminal is source or drain |
| 16 | Last metal height | Height of extreme right metal2 to metal4. This value may be independent of whether the terminal is source or drain |
| 17 | Row | Number of MOS in a single row |
| 18 | Column | number of MOS in a single column |

*Fig. 6E*

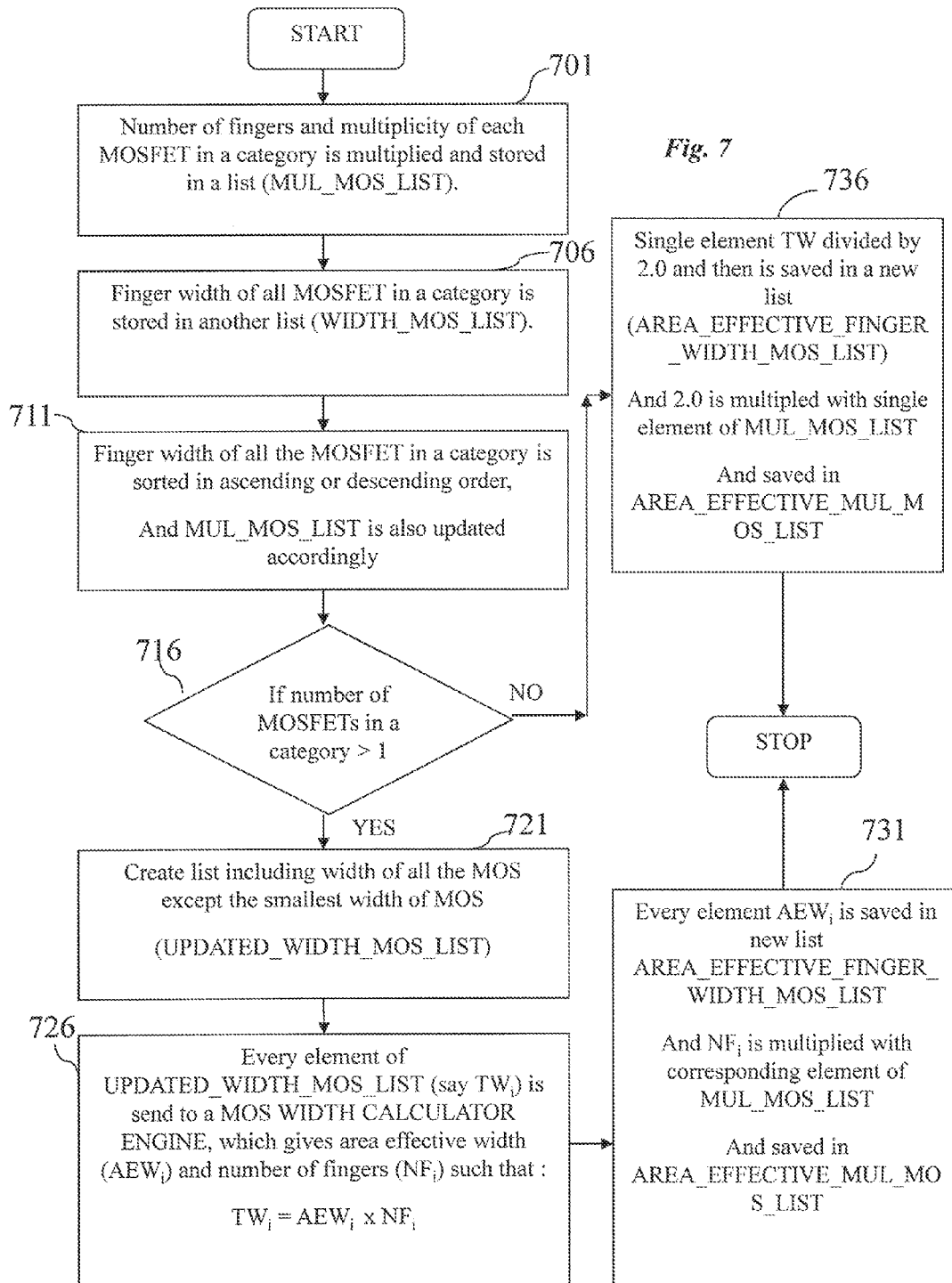

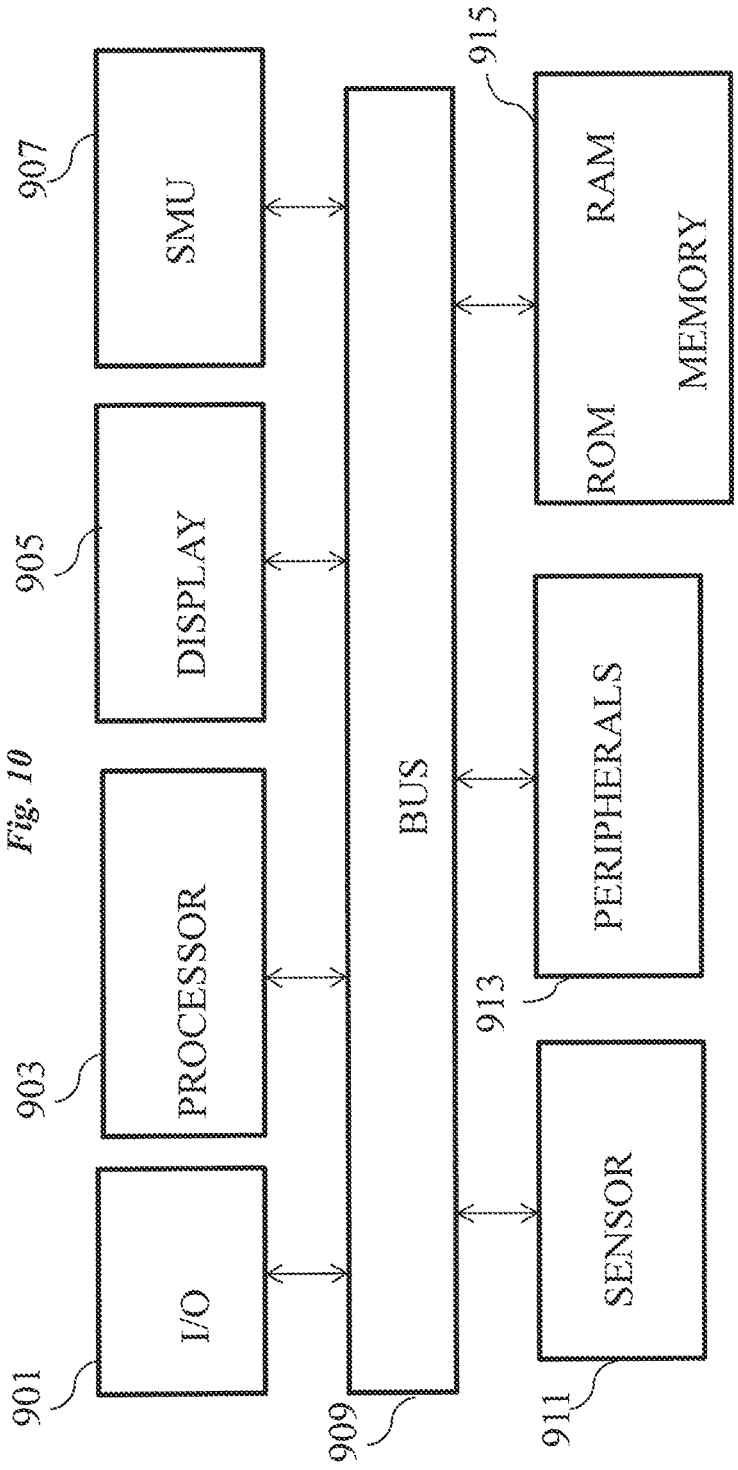

AREA OPTIMIZED DRIVER LAYOUT

TECHNICAL FIELD

The present invention relates generally to layout of semiconductor devices, and, in particular embodiments, to area optimized driver layouts.

BACKGROUND

Designing an integrated circuit of a semiconductor chip is a complex process. The chip is usually designed in a hierarchical system by a large group of people with information flowing back and forth. One of the features of designing a chip includes making the contact from the internal circuitry to the outside world. The external contacts are formed using input/output (IO)) pads, which are thick metal pads for facilitating contact. IO pads are typically designed along the periphery of the chip.

However, the IO pads are not directly connected to internal circuitry but through additional circuitry called IO blocks. IO blocks are the interface between internal circuitry such as core logic and the IO pads. Since IO pads are connected with external world, IO blocks need to support various applications and specifications, like impedance matching, slew, jitter. Accordingly, the IO blocks are designed and selected to meet certain minimum performance characteristic. This is required since specific IO blocks are required to, for example, buffer and condition signals in and out of the internal circuitry, provide electrostatic discharge (ESD) protection, electro migration, configuration for design for manufacturing.

The main block of the IO blocks which drives the IO pads is the pad driver block and is known as IO driver. The IO driver comprises of large fingered metal oxide semiconductor field effect transistors (MOSFETs) both n-channel MOSFET (NMOS) and p-channel MOSFET (PMOS), which are designed inside a p-well or an n-well.

The design of such IO drivers has to account for many issues. For example, due to continued scaling of semiconductor devices, the number of transistors in a circuit doubles approximately every 1.5 years facilitated by a corresponding shrink in area of the devices. To enable continued scaling, almost all features in a semiconductor device shrink from one technology generation to the next. The increased functionality of the chip produced by increasing the number of transistors in the chip also increases the number of input/output and power pins per chip. The resulting increase in the number of IO pads increases susceptibility to electrostatic discharge (ESD) and other challenges. This is because ESD events occur through the pins at the interface between the semiconductor chip and the outside world. Therefore, the layout of the IO driver has to be custom designed to protect the internal circuitry from ESD damage.

Electro-migration (EM) is another major phenomenon in the design of IO driver because very large amounts of current is drawn through the IO driver, which may result in breakdown of metal pads and/or lines if special care is not taken while estimating the metal width in designing the IO driver. The metal width controls the current density and therefore the susceptibility of the metal line to electro-migration damage.

However, all the above mentioned effects are layout dependent. Therefore, the layout design of IO driver is difficult and important because it directly impacts chip yield and therefore the total cost.

SUMMARY OF THE INVENTION

In accordance with an embodiment of the present invention, a computerized method for designing a layout of a driver includes analyzing a schematic circuit comprising PMOSFETs and NMOSFETs. PMOSFETs coupled between first common nodes are grouped into one or more first classes. NMOSFETs coupled between second common nodes are grouped into one or more second classes. The method further includes generating the layout for each MOSFET at each location in a layout area of the driver by generating a super parameterized cell (PCELL) layout block comprising a master MOSFET PCELL and a master guard ring PCELL for each of the first class and the second class. The master MOSFET PCELL includes a first set of parameters for the MOSFET and the master guard ring PCELL includes a second set of parameters for the guard ring around the MOSFET. The first and the second parameters include all design rules relating to the layout of the driver. The method further includes instantiating a child PCELL of the master MOSFET PCELL and the master guard ring PCELL at each location in the layout area, the child PCELLs inheriting all the first and the second parameters and including layout cell location information.

In accordance with an alternative embodiment of the present invention, a computerized method for designing a layout of a driver, the method comprises analyzing a schematic circuit comprising PMOSFETs and NMOSFETs and grouping MOSFETs coupled between first common nodes into one or more classes. A finger width is calculated for all MOSFETs in the one or more classes. A sequence in which the MOSFETs within each class of the one or more classes will be generated during layout generation is established. The number of fingers allowed in a guard ring and guard ring width for each class of the one or more classes is received. The layout of the driver is generated by generating a super parameterized cell (PCELL) layout block comprising a master MOSFET PCELL and a master guard ring PCELL for each class. The master MOSFET PCELL comprising a first set of parameters for the MOSFET and the master guard ring PCELL comprising a second set of parameters for the guard ring around the MOSFET. The first and the second parameters include all design rules relating to the layout of the circuit for the driver. The layout of the driver is generated by instantiating a child PCELL of the master MOSFET PCELL and the master guard ring PCELL at each location in a layout area of the driver. The child PCELLs inheriting all the first and the second parameters and including layout cell location information.

In accordance with an alternative embodiment of the present invention, a non-transitory computer-readable storage medium with an executable program stored thereon, wherein the program instructs a microprocessor to perform the following steps described above.

In accordance with an alternative embodiment of the present invention, a machine for layout generation comprises a microprocessor coupled to a memory, wherein the microprocessor is programmed to perform the following steps described above.

In accordance with an alternative embodiment of the present invention, a method of forming a semiconductor device comprises generating a layout using the steps described above. A mask is fabricated based on the generated layout and the semiconductor device is formed using the mask.

BRIEF DESCRIPTION OF THE DRAWINGS

For a more complete understanding of the present invention, and the advantages thereof, reference is now made to the following descriptions taken in conjunction with the accompanying drawings, in which:

FIG. 3, which includes FIGS. 3A-3D, illustrates an IO pad driver designed using embodiments of the present invention, wherein FIG. 3A illustrates an IO pad driver of a chip coupled between the internal circuitry and a IO pad, wherein FIG. 3B illustrates a top view schematic of a chip with a plurality of pads coupled to internal circuitry through a plurality of pad drivers, wherein FIG. 3C illustrates a magnified top view of an IO MOSFET enclosed by guard ring, and wherein FIG. 3D illustrates a magnified cross-sectional view of the IO MOSFET of FIG. 3C;

FIG. 4, which includes FIGS. 4A-4G, a methodology for layout generation in accordance with embodiments of the present invention, wherein FIG. 4A illustrates a hierarchical system for generating a layout for an IO driver, wherein FIG. 4B illustrates a master PCELL generated from an illustrative schematic circuit, wherein FIG. 4C illustrates a high-level flow chart of the layout generation method for IO drivers using the PCELL approach, wherein FIG. 4D illustrates the PCELL parameters that may be included in a parameterized cell, FIG. 4E illustrates an example of a PCELL hierarchy for a push-pull driver circuit, and wherein

FIGS. 6A-6E illustrate the parameters of the PCELL in accordance with embodiments of the present invention;

FIG. 7 illustrates a schematic flow chart of a layout generation method of generating a parameterized master PCELL in accordance with an embodiment of the present invention;

FIG. 10 illustrates a computer system implementing the embodiments of the present invention.

DETAILED DESCRIPTION OF ILLUSTRATIVE EMBODIMENTS

Embodiments of the present invention are described using an IO driver. However, the various embodiments of the present invention may be applied to any circuit having large transistors. Examples of such circuits include ballast transistors, GGNMOS, GGNBIMOS, and other MOS clamps. Additional examples include any circuit that includes only PMOS or only NMOS or both PMOS and NMOS.

Figure 1:
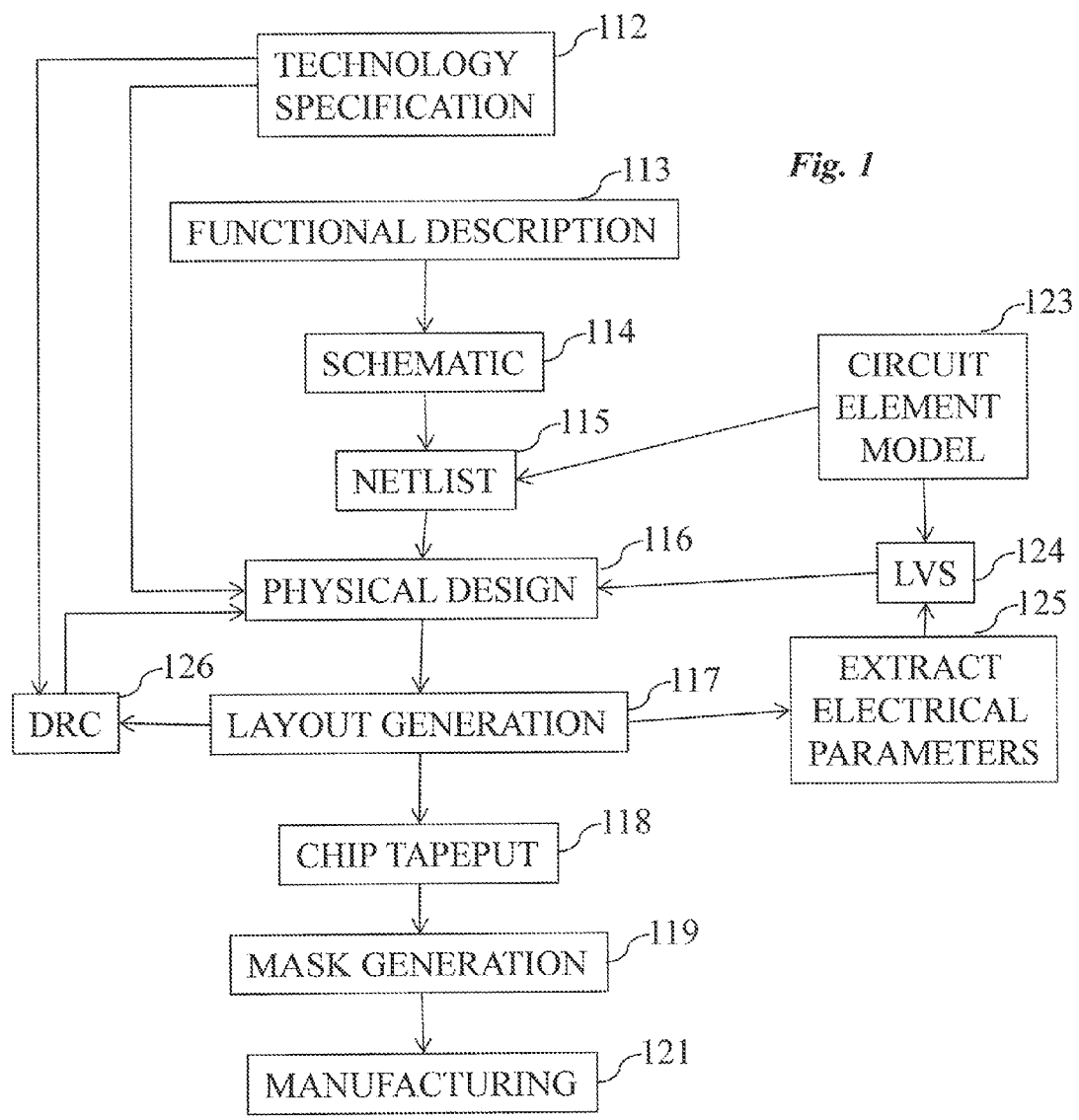
FIG. 1 illustrates a method of generating a layout in accordance with embodiments of the present invention.

FIG. 1 illustrates a method of generating a layout in accordance with embodiments of the present invention.

Design and manufacturing comprise two primary aspects of development of an integrated circuit. In its simplest form, a chip is designed by the designer and a layout comprising the functionality is taped out to the manufacturing engineers. The manufacturing engineers in turn take the taped out layout and produce a final chip performing the operation envisioned.

In a modern integrated chip development, design and manufacturing division have several levels of information transferring between them. For example, designers at a block level will perhaps only use high level information regarding the electrical functional of components from the manufacturing group. However, designers involved in physical layout will clearly require much more information. Hence, based on utility, this information flow can be divided into several groups. For example, the technology specification 112 which may be a Design Rule document from the manufacturing engineers. Semiconductor manufacturers (fabs) provide design rules that enable the designer to verify the correctness of a mask set. Design rules are specific to a particular semiconductor manufacturing process. A design rule set specifies certain geometric and connectivity restrictions, for example, to ensure sufficient margins to account for variability in semiconductor manufacturing processes. For example, this technology specification 112 could include an allowable range of pitches, spacings, and critical dimensions for the first mask level. Similarly, the technology specification 112 could also include an allowable range of overlap between the first and second mask layers to minimize misalignment errors, as well an allowable range of openings. For example, this could be a function of the pitches, openings and spacings allowed for the first mask layer. The technology specification 112 may also include other restrictions so that the fabricated chip has appropriate reliability and life time.

Further, device engineers, as well as compact model development engineers, would require information regarding the technology specification 112. The technology specification 112 may also include rules for circuit designer and layout engineers. Different design groups can be given the appropriate level of information. Each of these engineers optimizes the chip from their perspective. Thus, the developed layout at chip tapeout 118 includes a fully optimized product.

In designing integrated circuit chips, information is refined progressively to include more detail until a physical layout is made.

A functional description 113 of a product is progressively transformed into, for example, a schematic 114. The schematic 114 comprises multiple levels, wherein the lowest level is comprised of primitives such as single devices and each upper layer comprises successively complex blocks. For example, the top component of the schematic is a block generally describing the entire circuit at a gross level (i.e. controller, processor, etc.). The schematic 114 is comprised of individual devices such as resistors, transistors, capacitors, switches, etc. and other hierarchical blocks. A database or netlist 115 is then created of the schematic 114 in which every device is listed, along with its properties, connectivity and proper dimensions to verify information (e.g., which device is connected to which other device). The netlist 115 is still an abstract representation of the circuit. For instance, the netlist 115 may be generated with some knowledge of the manufacturing process, for example, from the technology specification 112. It may hence include numerical values for specific resistances, capacitances etc of interconnects, transistors and other devices, to simulate for example a standard cell or product. For example, the netlist 115 may be optimized to deliver a certain delay (performance), active and standby power etc. The netlist 115 is then translated into a layout 117 using physical design 116. Physical design 116 converts the abstract representation into a physical representation. Physical design 116 may include many steps such as floor-planning, place and route, compaction, and clock tree synthesis. A layout 117 of the integrated circuit is created after physical design 850. A state-of-the-art layout 117 includes a collection of many levels of geometrical description of the IC.

The transformation applied at each level in the design flow is generally verified. The layout 117 is rigorously tested and verified to satisfy all metrics. For example, a design rule check (DRC) tool 126 may test whether the layout complies with all the design rules. Such verification may include functional correctness and timing, among other performance metrics such as power consumption. An extraction tool 125 reads the designed layout 117 to extract circuit elements, their electrical connectivity, and their parasitics. A procedure called layout-versus-schematic (LVS) 124 takes this information along with circuit element models 123 to determine the functionality of the layout 117. This layout functionality is compared with the functionality of the schematic 114 or netlist 115 to determine the validity of the design. These processes may be iteratively performed until all conditions are satisfied.

The final layout 117 may be optimized either for a single component, for example performance, or a combination of factors, for example performance, process yield, process window, etc. The designed layout may be decomposed into different layers such that each layer comprises different designs for each mask step (or exposure). Each of these designs may be properly optimized for all required functionality. Although not discussed, each layer of the design may undergo optical proximity correction, and subsequently the layout is sent for mask generation 119.

This final layout 117 is taped out to manufacturing (chip tapeout 118). The design of the chip is used to generate appropriate masks 119. The masks are subsequently fabricated and the chip may be manufactured 121 using the masks 119.

In various embodiments, the process of physical design for layout generation of large components such as IO drivers is automated using a hierarchical system of parameterized cells. As will be further described in various embodiments, the IO driver circuit (or other circuits comprising large transistors) is categorized and divided into smaller hierarchical system of parameterized cells, which can be handled efficiently. In contrast, in a conventional method, every different element has to be manually drawn taking considerable time and cost.

Figure 2:
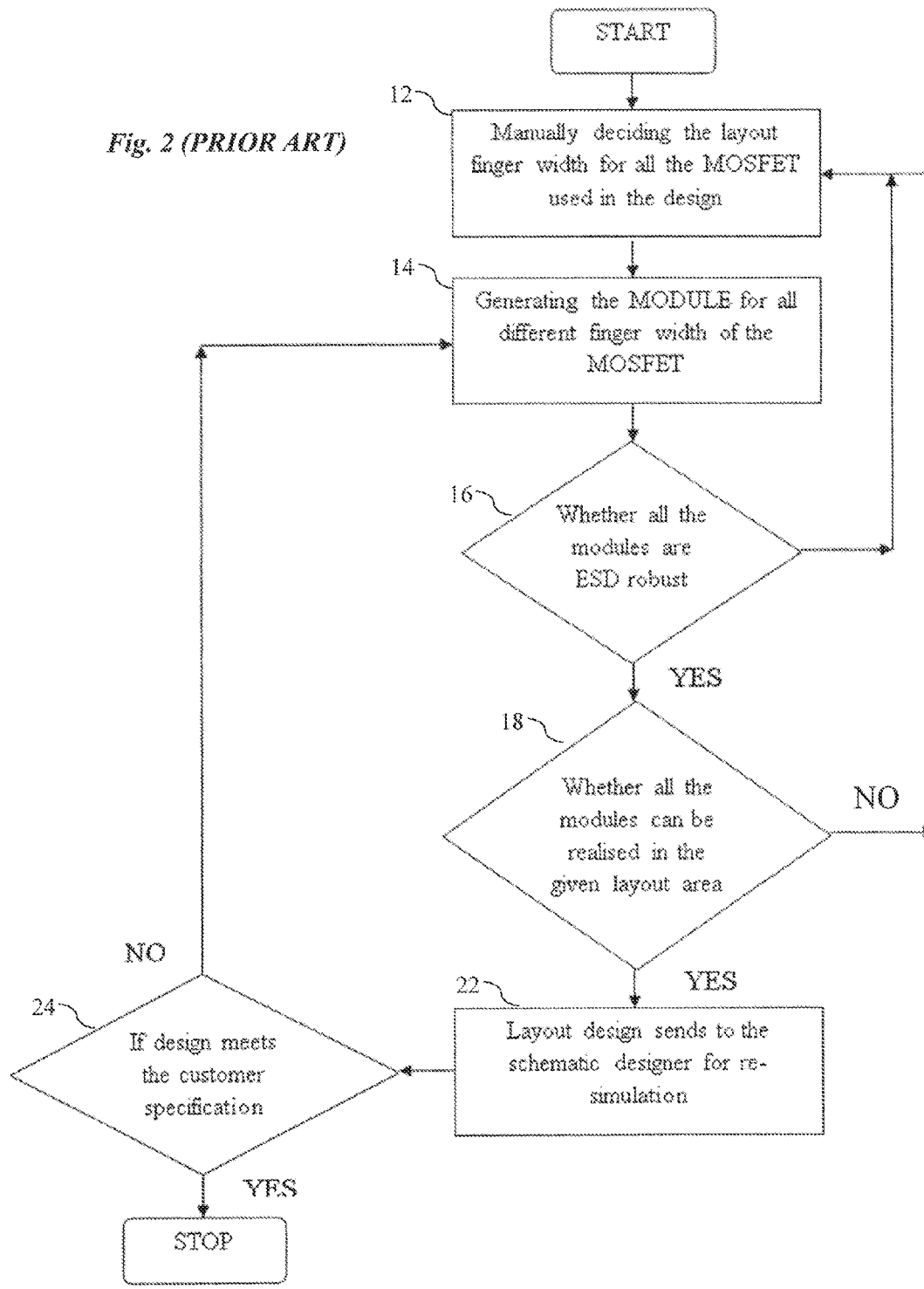
FIG. 2 illustrates a conventional method of designing an IO driver.

FIG. 2 illustrates a conventional method of designing an IO driver.

Conventionally, a modular approach is used to design a layout of IO's driver. In this approach, the layout designer manually generates one module which is repeated again and again across all the IO drivers. Thus, this approach reduces the designer's effort because only one module has to be designed. Such a module may be a well guard ring enclosing a number of MOSFETs.

Referring to FIG. 2, the layout designer manually decides the layout finger width for all the MOSFETs used in the design of the IO driver (box 12). A module is generated for each MOSFET having a different finger width (box 14). Each module may include the number of fingers of the MOSFET (PMOS/NMOS), well guard-ring enclosing the number of fingers (NWELL/PWELL), and metal connections of the MOSFET (PMOS/NMOS). Therefore, each NMOS or PMOS with a different finger width in the driver circuit has to be handled individually. Quickly, the number of MOSFETs that needs to be drawn becomes very large.

Next, each module is checked or adjusted for ESD robustness (box 16). Any module failing ESD, will be redrawn until the module passes the ESD test (box 16). Next, the layout is tested to check if all the modules can be designed within the given layout area (box 18).

The layout thus generated is sent back to the schematic designer for re-simulation of the functionality (box 22). For example, a LVS and DRC check may be performed at this stage. If the design meets customer specification, the layout is finalized (box 24). Using the methodology described in FIG. 2, during the schematic generation of the IO driver, there is no knowledge of the finger width of the MOSFET that is most area efficient. This causes a difference in the finger widths of the MOSFET in the schematic design and the layout design. The conclusion of the difference results in the difference in behavior between the schematic design and the layout design, for example, the well-known layout effect shallow trench isolation. Consequently, after the layout design is generated, the schematic designer has to rerun the simulation to check the functionality of the layout. To achieve the final finger width of the layout, this process (boxes 14, 16, 18, 22, 24) may have to be repeated until the designed layout meets all the specifications dramatically increasing the layout generation costs and time.

However, such an approach is useful only if all the MOSFETs used in the IO driver design have exactly the same or equal finger width and same length because any difference necessitates the designer to generate different modules for each type of finger width or each type of length of the MOSFET (NMOS/PMOS), which dramatically increase the number of modules.

Further, practically designing an IO driver using symmetrical MOSFET is only possible if the design is used only for one specific application. This limits the scope of usage of the IO driver in different applications. Multiple designs increase the cost of development as well as development time.

ESD compliance is difficult with the use of modular approach. This is because the number and orientation of the MOSFETs are dependent on the ESD strategy for a particular design, which is manually adjusted. However, in case, the ESD strategy changes after module generation then the whole module needs to be generated again.

In a modular approach, design for manufacturability (DFM) parameters such as some MOSFET parameters, e.g., drain/source area or active-poly spacing, and others may not be changed or updated after generation of the final layout. However, DFM parameters may require tweaking due to various reasons, for example, use of different fabrication facility, improve process yield, and others. With a conventional approach, any update of the DFM parameters requires a complete redrawing of the IO driver layout manually.

The exact layout finger width of the MOSFET is difficult to predict accurately during circuit design of the IO driver by the circuit designer. Therefore, in a conventional approach, the actual finger width on the layout is decided during layout generation by the layout designer. This requires additional feedback between the layout designer and the circuit designer.

Consequently, resizing of any parameter (like width/length) of the MOSFET after completing the design of the layout of the IO driver is a challenge. This is because modifications require a complete redo of the layout. In particular, there is no mechanism to automate the regeneration of the layout with the above methodology. Further, after regeneration, all the different modules have to be regrouped again. This whole process of regeneration and regrouping is purely manual. Additionally, because of the manual process, the performance of the layout after modification may be degraded.

Because of repeated changes requiring designing different modules, the module based layout design approach becomes ineffective as many different modules have to be designed.

The module based layout generation is not flexible with different frame architecture. IO designs are dependent on the architecture of the IO cell, which includes an IO frame, IO pad, and an IO pad driver. The cell frame defines the boundaries of the cell and may include multiple segments. The IO pad driver is laid out into the frame. Both the IO pad driver and cell frame may depend on the particular applicable standards. The cell architecture (width and length of cell/frame) varies both with design specification and with different technologies. However because of the fixed module size, the module methodology is restricted to only one type of frame and cannot be used in a different type of IO frame, even though the driver design is identical in both the frames. For example, shrinking an IO layout will compromise the ESD and EM immunity.

The module based approach also results in abutment errors during subsequent design rule check (DRC). This is because of either regrouping the different modules, which results in the abutment errors at cross-over of well guard ring or due to sharing a common node of MOSFET with different finger widths. For example, the contact connections from adjacent module may not align correctly with each other resulting in less than minimum contact spacing or generating extended contacts of improper dimensions.

In a module based approach, abutment error free design is virtually impossible. Therefore, practically, the metal and contact connection from the modules at the abutment interface or from at the sharing node interface of MOSFET with different widths are removed manually. Afterwards, these removed features are added back manually on top of every module after all modules are regrouped and generated.

FIG. 3, which includes FIGS. 3A-3D, illustrates an IO pad driver designed using embodiments of the present invention.

Figure 3A:
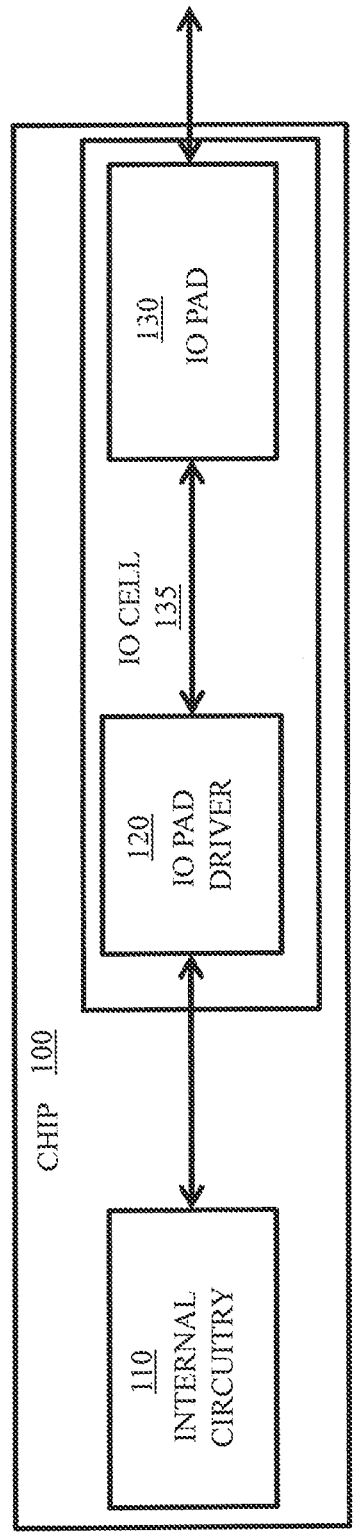

FIG. 3A illustrates an IO cell 135 of a chip 100. The IO cell 135 comprises an IO pad driver 120 of a chip 100 coupled between the internal circuitry 110 and the IO pad 130 in accordance with embodiments of the present invention. The IO pad 130 is connected with external nodes. IO pad 130 may be formed along the periphery of the chip 100. The internal circuitry 110 may be formed in a central region of the chip 100 while the IO pad driver 120 may be formed in an area around the chip 100.

Figure 3B:
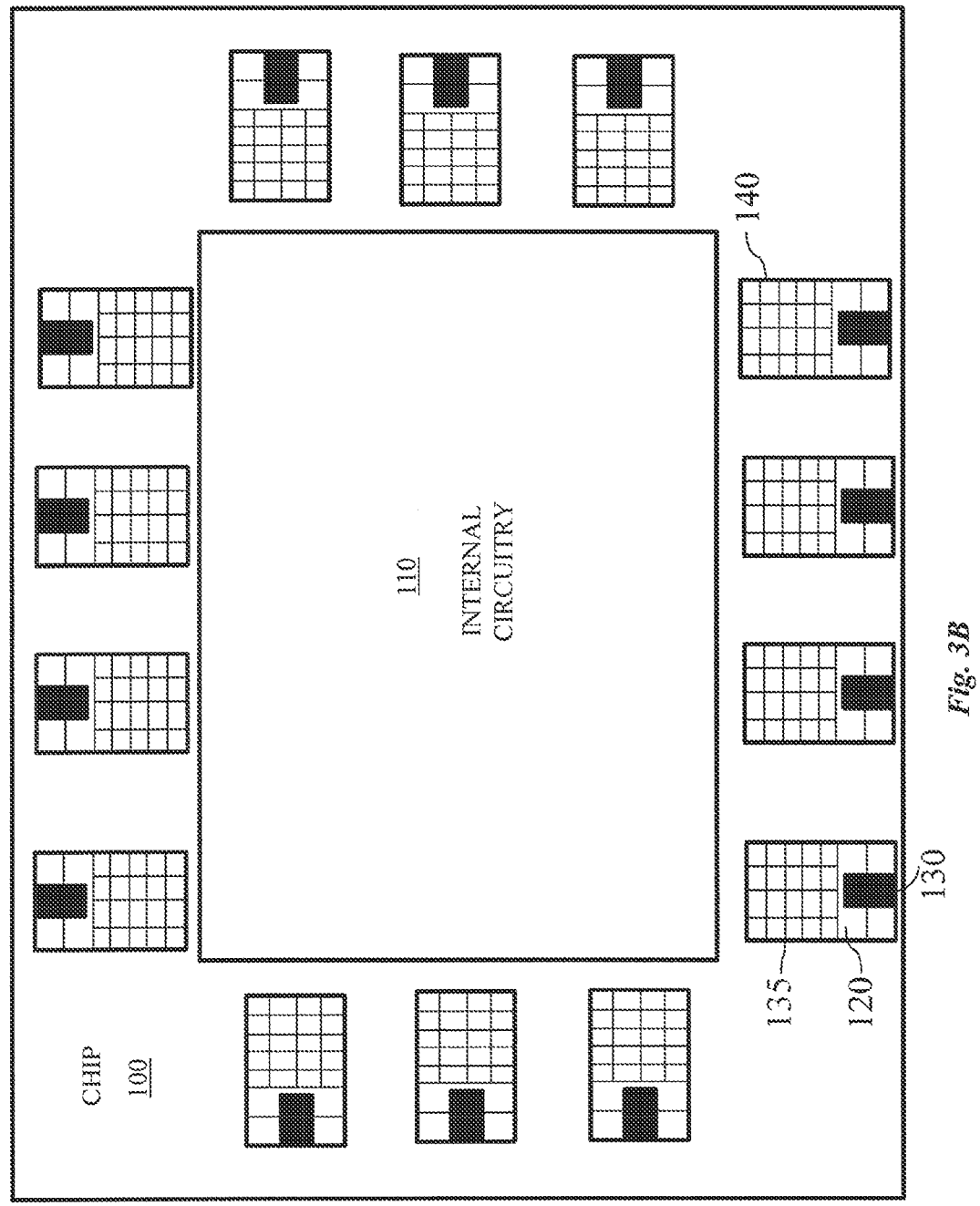

FIG. 3B illustrates a top view schematic of a chip with a plurality of pads coupled to internal circuitry through a plurality of pad drivers in accordance with embodiments of the present invention.

A chip 100 may comprise a number of IO cells 135. As illustrated, in FIG. 3B, a plurality of IO cells 135 are located around a peripheral region of the chip 100. The IO cells 135 on a chip 100 may have different functionality and may vary from another IO cell, for example, due to differences in standards. Each IO cell 135 includes a pad driver 120, an IO pad 130 and an IO frame 140. The circuitry of a pad driver 120 may be located within a frame 140. The frames 140 may include a plurality of sections having different lengths and widths as illustrated. Each pad driver 120 block includes a plurality of MOSFETs. One or more MOSFETs are enclosed in a guard ring as will be described in the magnified illustration of FIG. 3C.

Thus, the layout of the pad drivers 120 is a critical part of the layout generation of the chip 100. Any changes to the layout of the pad drivers 120 may become costly.

Figure 3C:
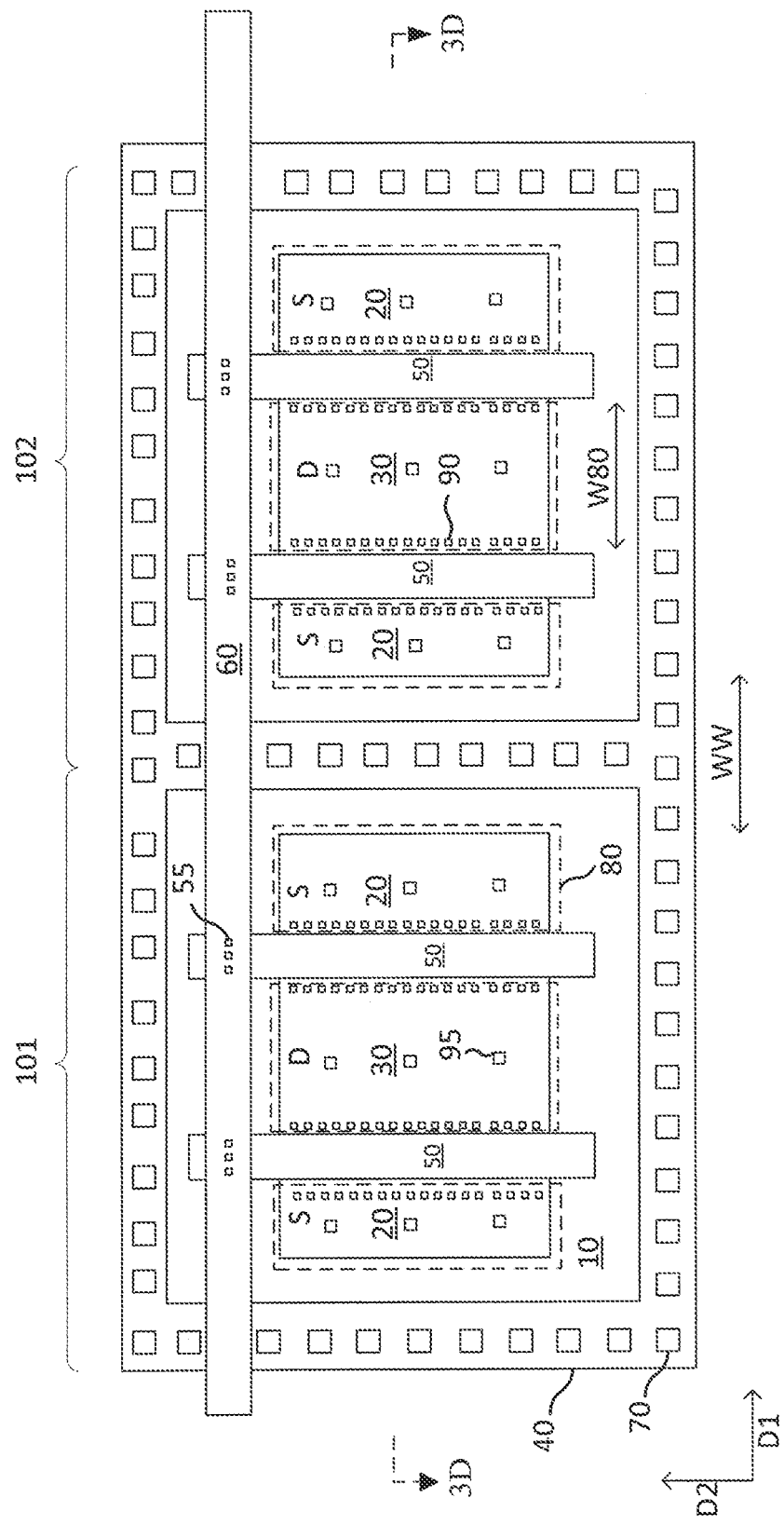
Figure 3D:
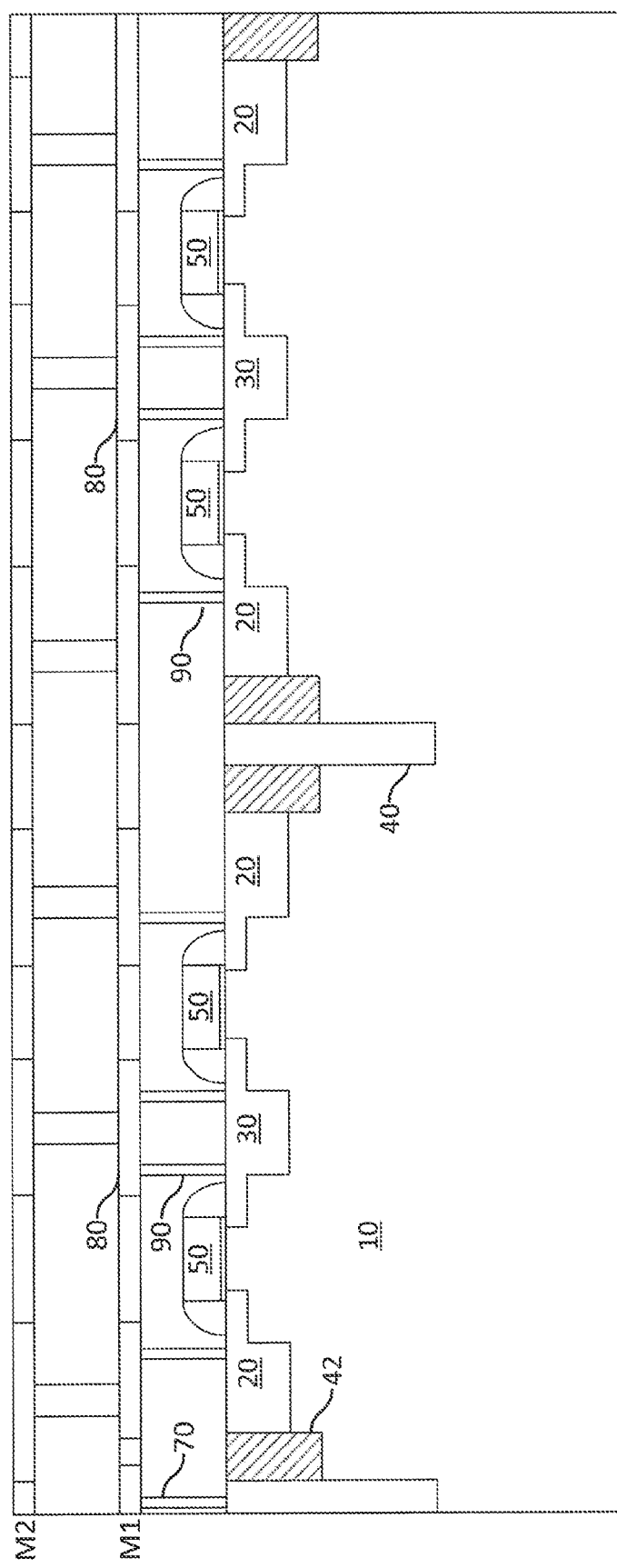

FIG. 3C illustrates a magnified top view of an IO MOSFET enclosed by a guard ring in accordance with embodiments of the present invention. FIG. 3D illustrates a magnified cross-sectional view of the IO MOSFET of FIG. 3C in accordance with embodiments of the present invention.

FIGS. 3C and 3D illustrates a magnified portion of the IO pad driver 120 and illustrates two MOSFETs formed within well region 10. In case of NMOSFETs, the well region 10 are doped to be p-type and incase of PMOSFETs, the well region 10 is doped to be n-type. Shallow trench isolation regions 42 may be formed over/adjacent the well region 10 separating adjacent MOSFETs.

A well guard ring 40 is formed around the active regions of the MOSFETs of the IO driver. The well guard ring 40 may be designed to prevent latchup. For example, the well guard rings may be doped p+ and configured to be connected to ground around NMOSFETs while in contrast, for PMOSFETs, the well guard rings may be doped n+ and configured to be connected to VDD. In some embodiments, a double well guard ring structure may also be used. For example, PMOSFETs may be surrounded by an n+ well guard ring formed in an n-well region, where the n+ well guard ring is connected to VDD. A subsequent p+ well guard ring may be formed in a p-well surrounding the n+ well guard ring and be connected to GND. The well guard ring 40 may also be designed to remove extra charge, for example, from an ESD surge, and to protect the internal circuitry of the chip 100.

In this illustration, each guard ring encloses two fingers 50 or gates of a MOSFET, which is connected to an adjacent MOSFET through the first metal line 60 in the first metal level. The fingers are also connected to each other through the first metal line 60, e.g., through gate contacts 55. In alternative embodiments, the fingers may be coupled to each other through the same layer (e.g., through metal or poly at the same level as the gate line). The metal lines coupled to the guard rings 40 and the metal lines coupled to the gates or fingers 50 are electrically isolated. For example, the metal lines (or guard ring contacts 70) in the first metal level above the guard ring are absent or alternatively, the fingers 50 are coupled together using a second metal level above the first metal level.

The guard rings 40 are coupled to upper metal layers through guard ring contacts 70, which are separated from each other by a minimum distance. The source 20 and the drain 30 are coupled to metal layer 80 on the first metal level through contact vias 90. The metal layer 80 on the first metal level may be further coupled to upper metal levels through metal one vias 95. The metal layer 80 may be coupled to pads of the IO either at the same metal level or at upper metal levels. Therefore, the metal layer 80 may also be more susceptible to electro-migration and other effects because of the large currents flowing through them. Although, illustrated here, in some embodiments, the source terminal and the drain terminal may be reversed, for example, the transistors may have a common source with separate drain regions facing the guard rings.

During the generation of the layout, many of these parameters have to be considered and designed to comply with design rules for latchup, ESD, electro-migration while taking up least amount of area.

FIG. 4, which includes FIGS. 4A-4G, a methodology for layout generation in accordance with embodiments of the present invention.

Figure 4A:
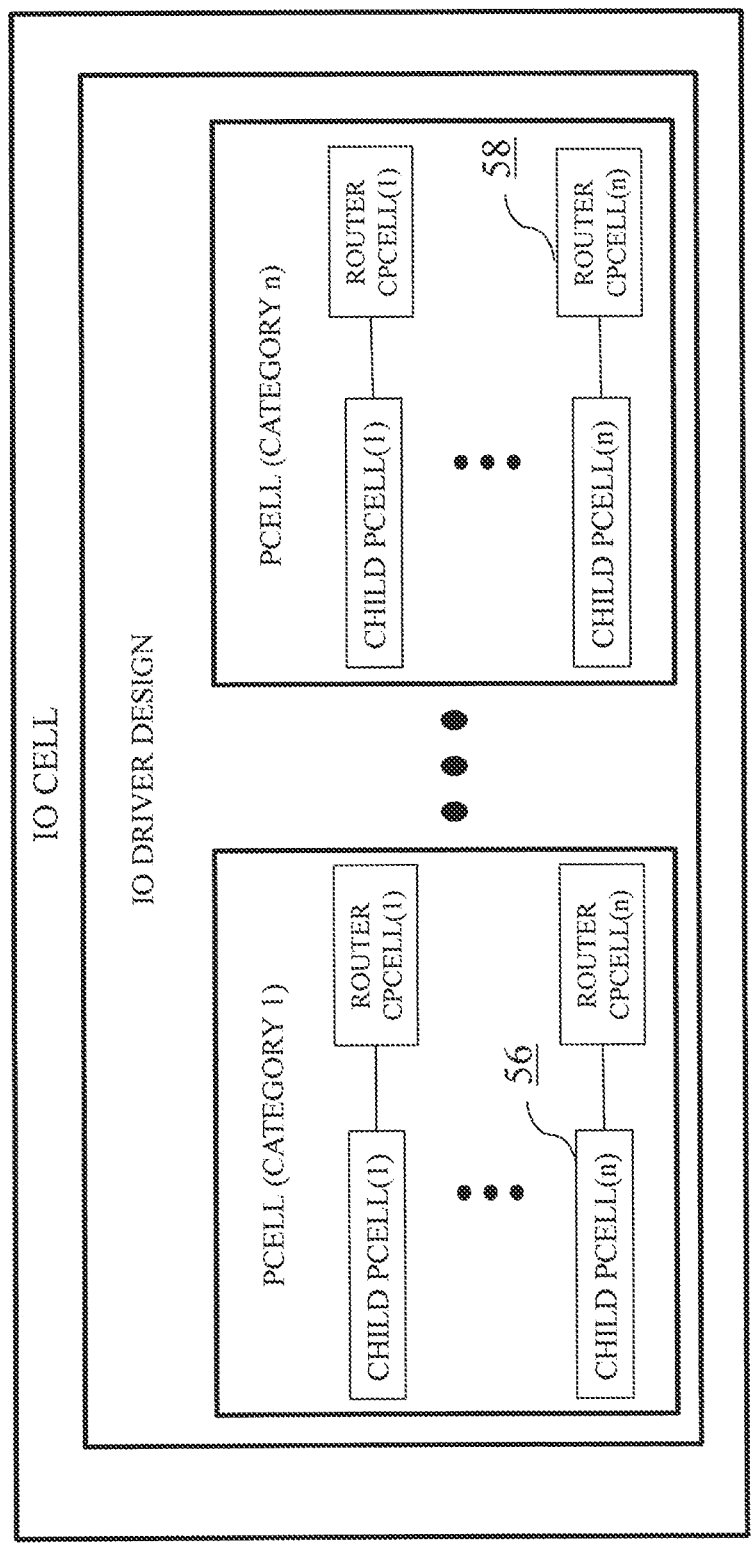

FIG. 4A illustrates a hierarchical system for generating a layout for an IO driver. In this system, the IO CELL includes a IO driver design, which is divided into a number of parameterized cells (PCELLS), where each PCELL has a common functional circuit element.

PCELLs are a computer model of the transistor including all the functional, design and layout features that are needed for the computer to generate a layout. Although all the parameters of the PCELLs are flexible and may be changed by the user, some parameters may be initialized at the time of creation of the master PCELL. The initialization may be hard coded or based upon user input. For example, the user may enter the necessary ESD protection while the design of the circuit may be fixed. In various embodiments, the PCELLS includes all the limitations of the functional element and includes all the design rules for latch-up, ESD, electro-migration, for example.

Figure 4B:
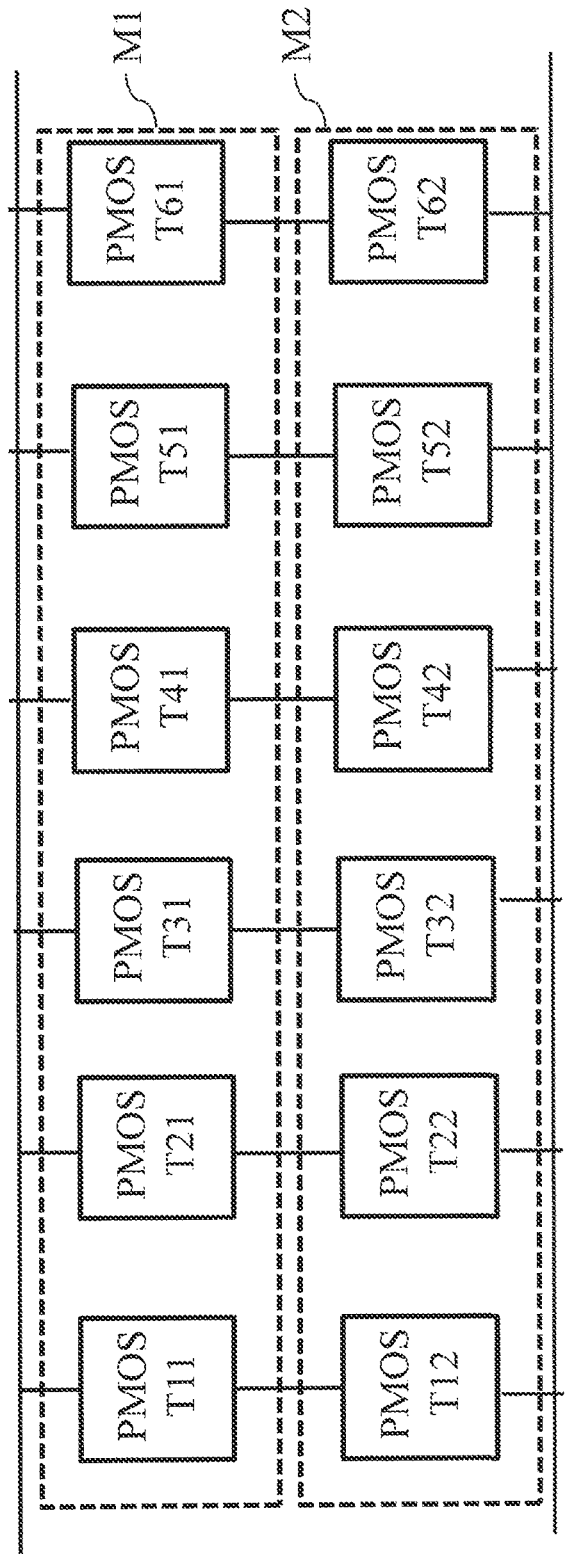

FIG. 4B illustrates a master PCELL generated from an illustrative schematic circuit. IO drivers may have different structure depending on application. Examples include cascoded structure, silicided block MOS, MOS with resistor, push-pull structure.

As illustrated in FIG. 4B, a circuit design is analyzed to determine the minimum functional elements or transistor needed to represent the circuits for each type of transistor (PMOS and NMOS). In one embodiment, elements that are in parallel are represented by a common master PCELL. In another embodiment, elements connected to the same source terminals and the same drain terminals are classified as a master PCELLs. In another embodiment, elements connected to at least one common node are classified into a common master PCELL. In another embodiment, elements that are configured similarly, i.e., connected to similar types of nodes, are classified into a common master PCELL. In a further embodiment, if more than one transistor is coupled in series between two input nodes, the transistors may be categorized into separate master PCELLs or into a same master PCELL. As one illustration, in various embodiments, MOSFETs having common source terminals and common drain terminals irrespective of their gate terminal (i.e., source terminals are coupled together to a common node while drain terminals are coupled together to another common node) is grouped into one category or class. For example, in FIG. 4B, the sources of the PMOS transistors P11-P61 are connected to a common node, while the drains of the PMOS transistors P12-P61 are connected to a common node. Therefore, the circuit may be reduced two master PMOS transistors (M1 and M2) representing all the twelve transistors. A similar illustration may be formulated for NMOS transistors.

The master PCELL then generated and is named a cell, for example, MASTER_PCELL_PMOS1, and is stored in a library. The library is an entity, which contains a number of cells. The uppermost cell or TOPCELL in the library defines the functionality of the corresponding IO standard. TOPCELL in the library is a block including all the cells of the library hierarchically. Then the child PCELL of the corresponding MASTER PCELL is instantiated in the IO DRIVER cell and its parameter is updated, if necessary. The IO DRIVER cell may be a part of the same library comprising the MASTER PCELL or may be in a different library. Because of the hierarchical system, children (child PCELL 56) of the master PCELL inherit all the parameters of the master PCELL. When designing a new IO cell, the existing master PCELL from any library may be used to avoid cost of redevelopment.

Advantageously, the parameters do not have to be input into each child. However, the parameters of the child PCELL 56 may be changed without changing the parameters of the master PCELL. Therefore, a particular child PCELL may be changed without changing all other child PCELLs of the same master PCELL. Further, advantageously, the layout of the master and child PCELLS may be similar until one of the child PCELL is changed without changing the master PCELL. Similarly, another child PCELL is generated for the metal routing router child PCELL or router CPCELL 58. The parameters of the router CPCELL 58 may similarly be set in the master PCELL or changed independently in the router CPCELL 58.

Figures 4C, 4D:
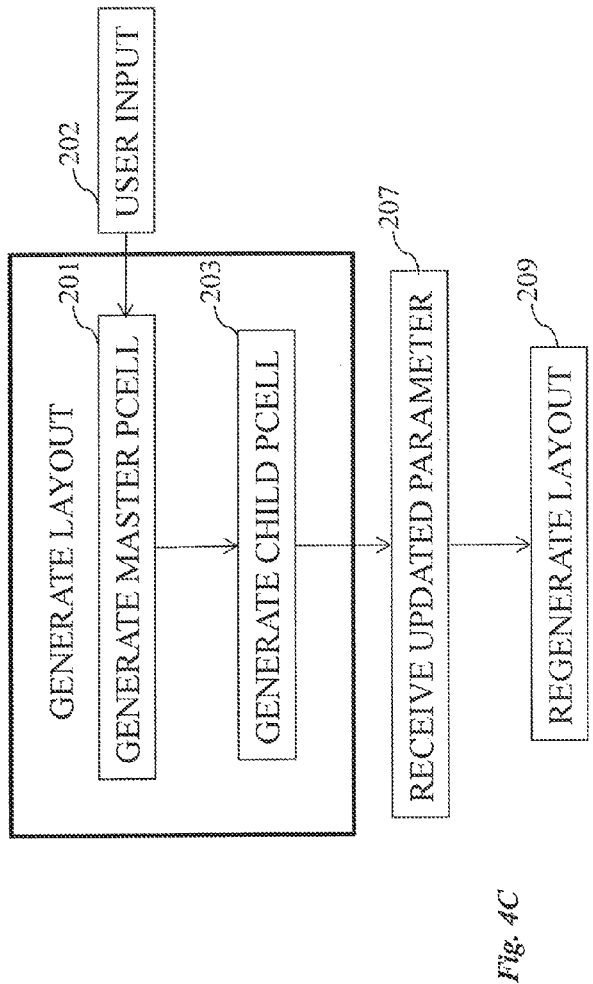

FIG. 4C illustrates a high-level flow chart of the layout generation method for IO drivers using the PCELL approach. Referring to FIG. 4C, the IO driver circuit is obtained from the circuit designer. The IO driver circuits for all pads on the chip are analyzed. Based on the driver circuits, one or more master parameterized cells (PCELL) are generated (box 201). In one or more embodiments, some of the initial values of a few parameters of master PCELL may be user defined and the rest may be hardcoded. For example, user defined initial values of master PCELL parameters may be taken from a user while generating the master PCELL (box 202).

In contrast to a conventional module based approach, in a master PCELL, all relevant design rule parameters including ESD, EM, and latch-up parameters are parameterized within the PCELL. Therefore, the master PCELL is compliant with LVS and DRC.

Next, one or more child PCELL is instantiated (box 203) at each location of the master PCELL in the layout cell. Additional input from the user may be taken after instantiating the child PCELL. However, additional changes may be easily incorporated even if there is any further update of the parameter (boxes 207 and 209) and a layout is regenerated using an automated process.

For example, in one embodiment, a master PCELL with two PMOS transistors in series and two NMOS transistors in series may be created for a cascode driver circuit. Similarly, in another embodiment, a master PCELL with a PMOS and a NMOS may be created for a push-pull driver circuit. And in another embodiment, PMOS/NMOS may be connected to IO-PAD through a resistor. The PMOS/NMOS may be silicided or non-silicided in all the above embodiments.

FIG. 4D illustrates that the PCELL parameters may include circuit/functional level parameters, design for manufacturing parameters, ESD parameters, and/or electro-migration parameters in various embodiments of the present invention.

Figure 4E:
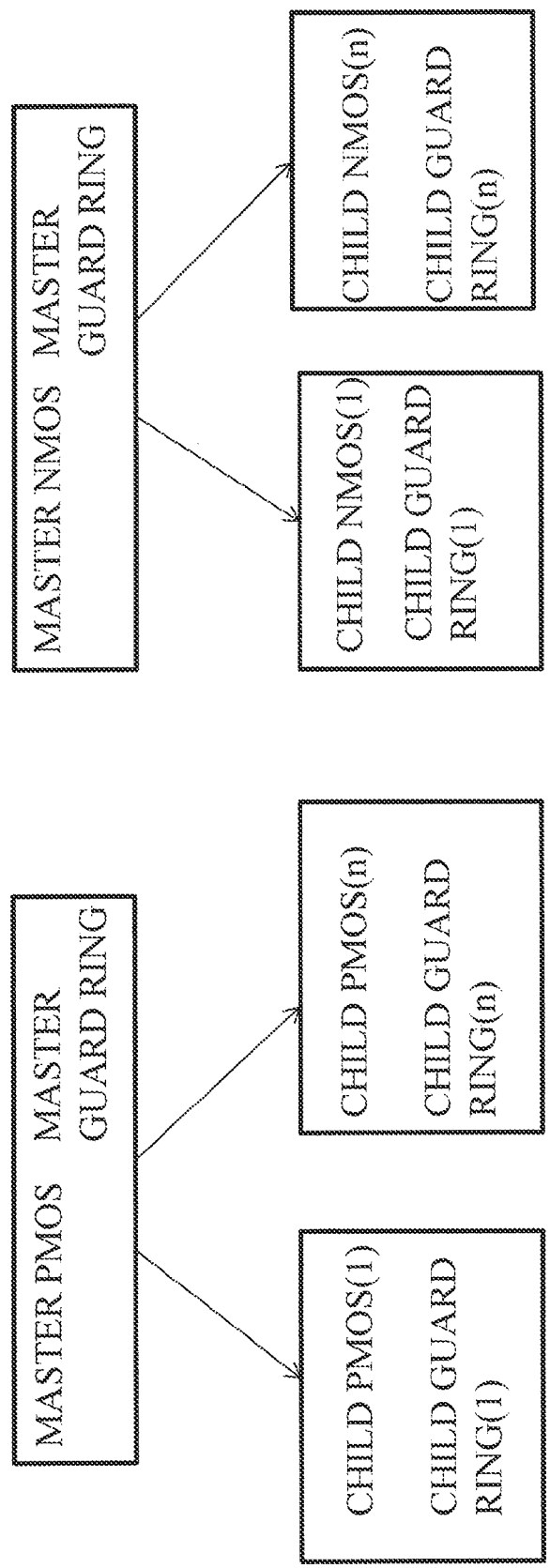

FIG. 4E illustrates an example of a PCELL hierarchy in accordance with embodiments of the present invention.

In one illustration, a push-pull driver circuit includes a PMOS master PCELL and a NMOS master PCELL. Each of these master cells has an associated master guard ring PCELL. Once the master PCELLs are formulated, the corresponding child PCELLs may be instantiated in the layout area of the pad driver as described above.

Figure 4F:
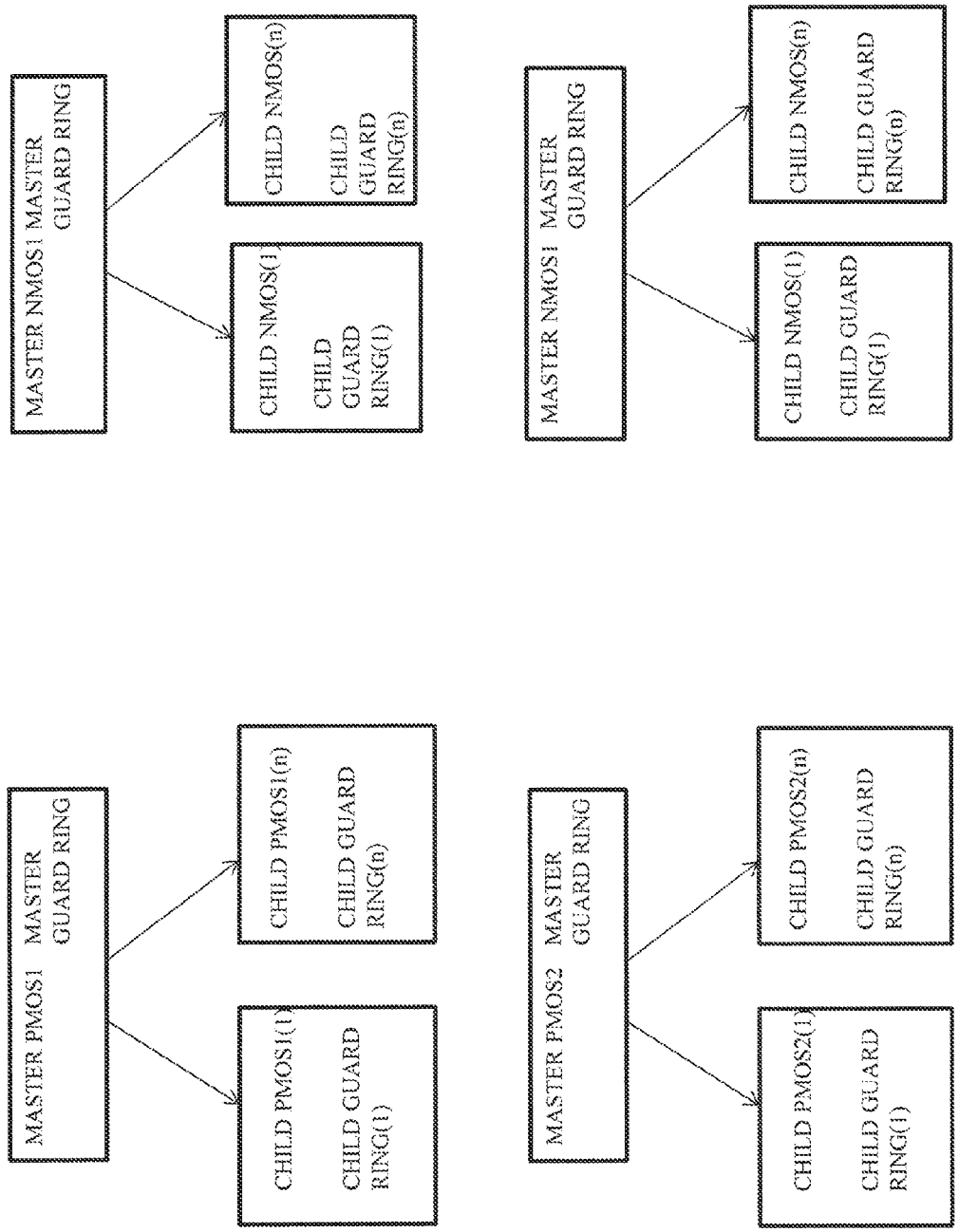
FIGS. 4F and 4G illustrate examples of a PCELL hierarchy for a cascode driver circuit.

FIG. 4F illustrates an example of a PCELL hierarchy in accordance with embodiments of the present invention.

In one illustration, a cascode driver circuit includes two PMOS master PCELLs and two NMOS master PCELLs. Each of these master cells has an associated master guard ring PCELL. The master PCELLs have corresponding child PCELLs.

Figure 4G:
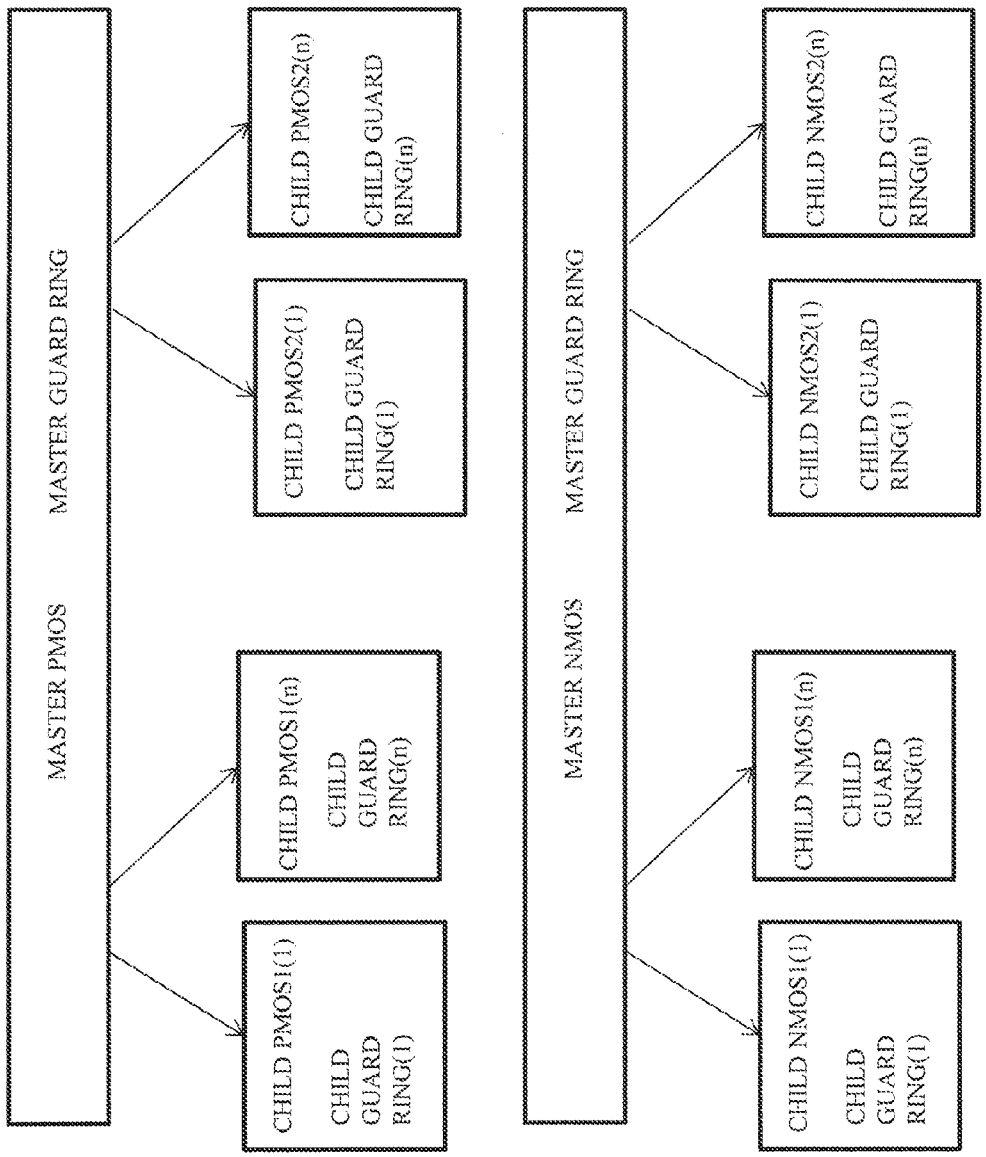

FIG. 4G illustrates an example of a PCELL hierarchy in accordance with alternative embodiments of the present invention.

In alternative embodiments, instead of instantiating two different PCELL as in FIG. 4F, the user may generate a single master PCELL and then instantiate its corresponding two child PCELLs as in FIG. 4G. For example, the user may instantiate the CHILD PCELL1 twice and then one of the CHILD PCELL parameters may be updated in order to realize it as a CHILD PCELL2.

Figure 5:
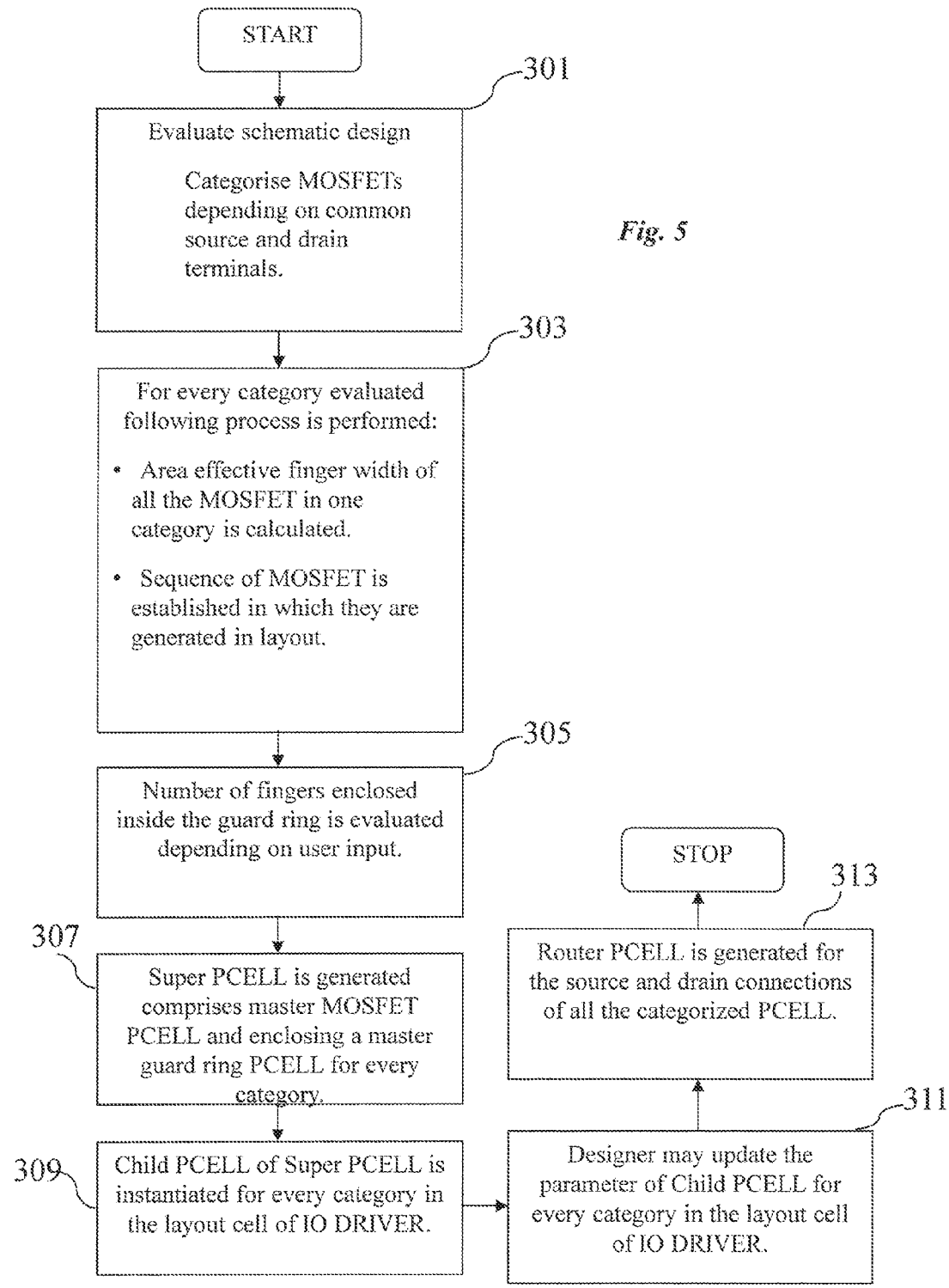
FIG. 5 illustrates a more detailed flow chart describing the layout generation in accordance with an embodiment of the present invention.

FIG. 5 illustrates a more detailed flow chart describing the layout generation in accordance with an embodiment of the present invention.

Referring to FIG. 5, in step 301, in various embodiments, the schematic design of the IO driver circuit is analyzed. In particular, the MOSFETs in the driver circuit are analyzed to identify units of MOSFETS into different classes. As one illustration, transistors coupled between two common nodes (or in parallel) may be grouped into one class. In another illustration, if more than one transistor is coupled in series between two common nodes, then the grouping may be modified into multiple groups so that each group includes one of the serially connected transistor. For example, a large IO driver circuit having a push-pull driver circuit may be categorized into a single PMOS transistor and a single NMOS transistor coupled in series. In another example embodiment, a cascode driver circuit may be categorized as two PMOS transistors and two NMOS transistors.

For each identified or categorized units of MOSFETs, the finger width of all the MOSFETs is calculated to optimize the area (box 303). The area optimization will be described below using FIGS. 7 and 8. A sequence of MOSFETs is established in which the MOSFETs will be generated in the layout. For example the sequence is established in order to optimize the area, i.e. the MOSFET are arranged in ascending or descending order with respect to their finger width. Accordingly, the sequence is generated in accordance with abutment rules when horizontal and/or vertical regions of adjacent guard rings abut each other and abutment of two adjacent MOSFETS of different width.

As next described in box 305, the number of fingers enclosed inside the well guard ring is evaluated. In one or more embodiments, this number may be obtained from a user input, i.e., input from the layout designer. For example, two gate fingers or three gate fingers are assigned in each guard ring.

A master PCELL is generated for each category identified above (box 307). The master PCELL has the finger width needed to optimize area and the number of fingers enclosed inside the guard ring provided by the user in one or more embodiments. Further, the master PCELL may include all the design rule parameters so as to be compliant with DRC and LVS. In one or more embodiments, the master PCELL may comprise a MOSFET PCELL and a guard ring PCELL enclosing the MOSFET PCELL. MOSFET PCELL and guard ring PCELL may be used to change the layout, for example, the number of MOSFETs in a well or the finger width may be changed depending on user input. As an illustration if an user requests a change in gate width, this user input is given to the master PCELL. However, the user input can be used only if the MOSFET is generated as a PCELL and not as a polygon (with no parameters). Similarly, the number of guard rings or length of guard ring can be provided by the user only if the guard ring is generated as a PCELL. The number of fingers in a guard ring may be adapted to match ESD requirements.

A child PCELL is instantiated at every location in the layout cell corresponding to the master PCELL (box 309). The child PCELL inherits all the parameters from the master PCELL.

As also illustrated in box 311, the designer can further update the parameter of the child PCELL without changing the other children (or child PCELLs) of the master PCELL and MASTER PCELL itself. The update may be received at the time the layout is generated or alternatively the design may be used in another IO driver with different specifications. Instead of generating a new MASTER PCELL, the same master PCELL may be reused in various embodiments. However, this may require updating the CHILD PCELL.

Next, as illustrated in box 313, a router PCELL is generated for the source and drain connections for all the MOSFET PCELL. The router PCELL may also include a hierarchical parameter set in some embodiments. The router PCELL includes the parameters relating to the metal layer over the transistor structures. The router PCELL accounts for the electro-migration values provided by the user. For example, the user may provide the metal width based on the current rating of the IO pad being designed. FIGS. 6D and 6E provide a more detailed example of the parameters of the router PCELL.

Accordingly, in various embodiments, a method for designing a layout of an input/out (IO) pad driver comprises analyzing the pad driver circuit to group PMOSFETs having common source and common drain terminal irrespective of their gate terminal into one or more categories or classes. Similarly, NMOSFETs are grouped into a different categories or classes. For example, a cascode driver may be grouped into two PMOS classes and two NMOS classes. Next, for each category or class of transistor, a sequence of MOSFETs is developed so as to have one to one layout and schematic mapping. A finger width for each MOSFET in each category is identified that optimizes layout area. The number of fingers enclosed inside a well guard ring is identified, for example, based on user input. The width of a well of each MOSFET in each category or class is defined. Subsequently, a super PCELL for each category or class is generated. The super PCELL for each category may include a MOSFET PCELL and a guard ring PCELL according to the sequence of MOSFETs. Next, a child PCELL of the super PCELL is instantiated for each category in a layout view of the IO pad driver. Any necessary user input may be received and the child PCELL may be updated without updating the master PCELL. A router PCELL for routing source and drain terminal of all child PCELLs is generated.

FIGS. 6A-6D illustrate the parameters of the PCELL in accordance with embodiments of the present invention. Some of the parameters of the master PCELL relating to the MOSFET PCELL and the guard ring PCELL are illustrated in the table of FIGS. 6A-6C while the parameters used in the router PCELL are illustrated in the table of FIGS. 6D and 6E. The router PCELL parameters are provided for the first few metal layers but may be extended to more metal layers.

FIG. 7 illustrates a schematic flow chart of a layout generation method of generating a parameterized master PCELL in accordance with an embodiment of the present invention.

FIG. 7 illustrates the generation of the area effective finger width described in FIG. 5. Referring to FIG. 7, the number of fingers and the multiplicity (number of times the PMOS or NMOS occurs in the circuit) is multiplied for all MOSFETs in each category (e.g., PMOS or NMOS) and is stored in a first list, e.g., a multiplicity MOS list (MUL_MOS_LIST) (box 701). For example, in case of a cascode driver (two NMOS and two PMOS), four first lists, each having a product of number of fingers and multiplicity, are stored. The finger width of all MOSFETs in each category is stored in a second list e.g., a WIDTH_MOS_LIST (box 706). For example, in case of a cascode driver (two NMOS and two PMOS), four second lists, each having a list of finger widths, are stored. The finger width of all the MOSFET in each category is sorted in ascending or descending order and the first list is updated accordingly (box 711).

The number of MOSFETs in a particular category (PMOS or NMOS) is evaluated. For example, in a push-pull driver circuit, the MOSFETs per category is one. If the number of MOSFETs in a particular category is exactly equal to one, then the number of fingers of the single MOSFET is doubled (box 736). To do so, the finger width is divided by at least two (e.g., 2) and saved as a new third list. The first list is multiplied by the same factor (e.g., 2×) to prevent changing the electrical functionality of the circuit. In other words, the number of transistors is increased by the same factor used to reduce the width so as to maintain the functionality. Thus, in this example, a single MOSFET having a first finger width is now divided into two MOSFETs having half the original finger width. As an illustration, if the single MOSFET had a width of 5 μm and a multiplicity of 20, the area effective MOSFET has a width of 2.5 μm and a multiplicity of 40.

If the number of MOSFETs in a particular category is more than one, then the larger MOSFETs are adjusted to a width similar to the smallest MOSFET in the list as described in boxes 721, 726, and 731. For example, in a cascode driver circuit, the MOSFETs per category will be more than one, e.g., there are two PMOS in a category. There is a possibility that the first PMOSFET in the category has a different finger width than the second PMOSFET in the category. In this case, the width of the smallest transistor is identified. The widths of all the other MOSFETs are scaled to be similar to the smallest width transistor. To avoid changing the electrical functionality, the number of fingers is increased by the same factor by which the width is reduced so that the effective width (product of number of fingers with width) of the transistors is not changed.

First, as described in box 721, a list comprising the width of all the MOSFETs except the smallest width MOS is generated and stored as fourth list. Next, every element of the fourth list is sent to a MOS WIDTH CALCULATOR ENGINE, which gives an area effective width (AEW) and number of fingers (NF) such that the original finger width can be computed by multiplying the area effective width and the number of fingers (NF). Thus, all the MOSFETs may be drawn to have an area effective width AEW and the number of fingers is adjusted to obtain the original width.

Figure 8:
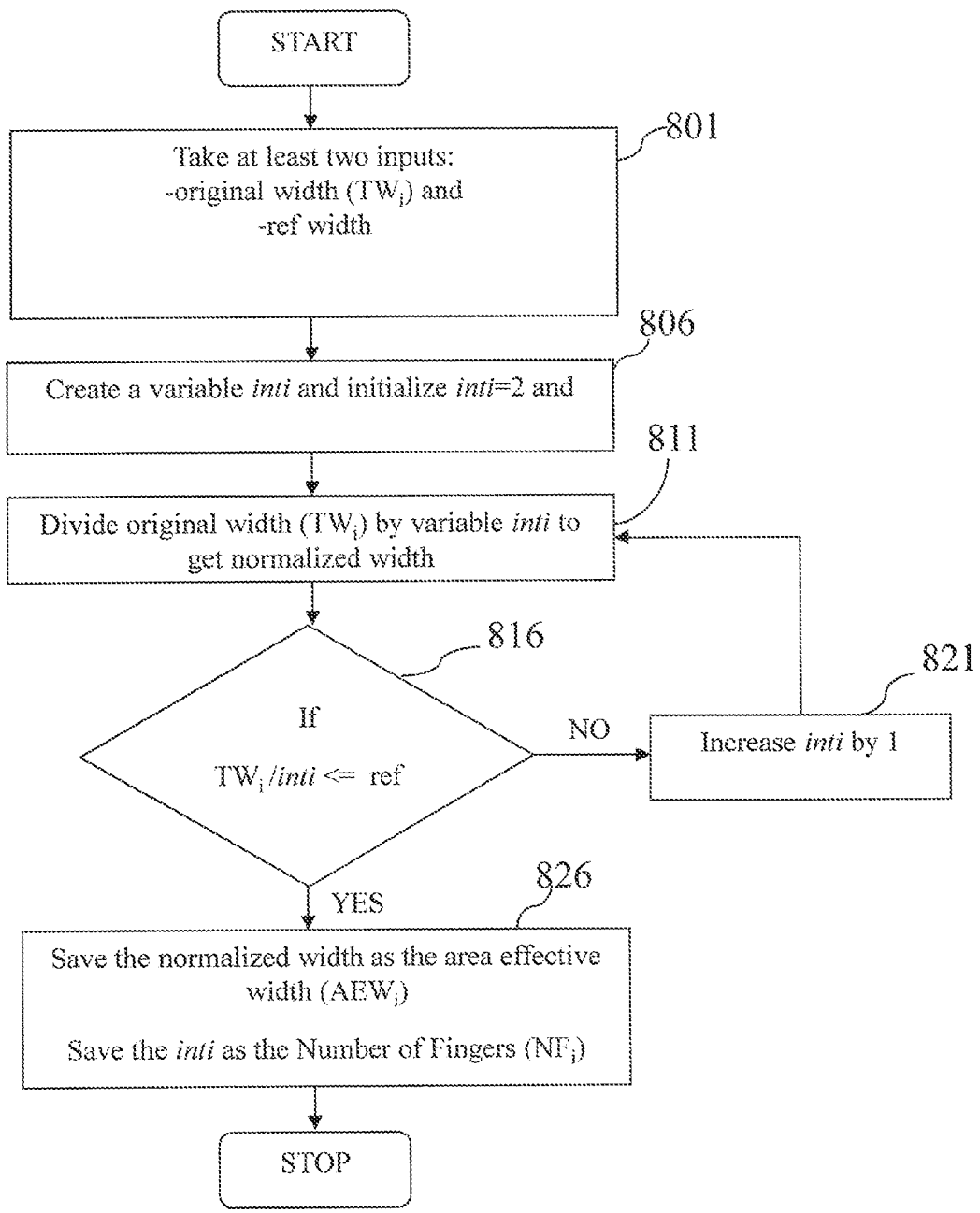
FIG. 8 illustrates a schematic flow chart of the MOSFET width calculator engine for computing an area effective width for each MOSFET in a master PCELL in accordance with an embodiment of the present invention.

FIG. 8 illustrates a schematic flow chart of the MOS WIDTH CALCULATOR ENGINE for computing an area effective width for each MOSFET in a master PCELL in accordance with an embodiment of the present invention.

Referring to FIG. 8, the MOS WIDTH CALCULATOR ENGINE receives the width and reference width of the MOSFETs (box 801). The width is the actual width of the MOSFET, for example, as required by the circuit designer while the reference width may be the smallest width of the MOSFETs in the driver block in a particular category.

As next illustrated in box 806, the variable inti is initiated and set to a value 2. The actual width is divided by the variable initi (box 811) to obtain a normalized width. The normalized width is compared with the reference width (box 816). If this normalized width is greater than the reference width, the variable initi is incremented and the steps of boxes 811 and 816 are recomputed. However, if the normalized width is less than or equal to the reference width, the normalized width is saved and returned by the MOS WIDTH CALCULATOR ENGINE as the area effective width with the multiplicity equivalent to the value of the variable initi. For example, if the original width was 10 μm with a multiplicity of 10 and the smallest width was 3 μm, the normalized width would 2.5 μm with a multiplicity of 40. The method of FIG. 8 is an illustration and in various embodiments a different method may be used to generate the scaling factor for dividing the width and multiplying the number of fingers.

Advantageously, embodiments of the present invention include all ESD guidelines using all the possible combinations of the number of fingers of MOSFET and their orientation with respect to the enclosing well and with respect to each other. This allows a user to choose the required combination for the particular design through the parameters of the PCELL.

Embodiments of the present invention may be used for symmetrical finger widths of MOSFET or for different finger widths, because the area effective finger width is computed. Different finger widths are easily incorporated into the layout without area penalty by scaling the finger width and multiplicity (number of fingers).

Embodiments of the present invention improve efficiency by providing flexibility to reuse same super PCELL in different architectures of the IO frame. For example, the designer may change the width of the layout design of IO driver according to the width of the frame. However, the super PCELL may be reused.

Embodiments of the invention allow the use of same design to be used in different technologies with slight modification in the finger widths and length of the MOSFETs, to account for variation in technology constraints, without generating the whole super PCELL.

Advantageously, there are no abutment issues inside the super PCELL because of dedicated parameters, which ensure DRC rules are satisfied both at the common sharing node of the abutting MOSFETs with different finger width and at cross-over of the abutting guard rings.

Electro-migration compliance is achieved by designing the required metal width needed by the layout designer for the particular current in the IO driver.

Embodiments of the invention may be applied to circuit blocks with large MOS transistors. For example, in ballast MOS in regulators, grounded-gate NMOS (GGNMOS), grounded gate bidirectional NMOS (GGNBIMOS), or MOSWI clamps in ESD protection devices. Other examples include any circuit with only PMOS or only NMOS or both PMOS and NMOS may be implemented using this methodology.

Figure 9A:
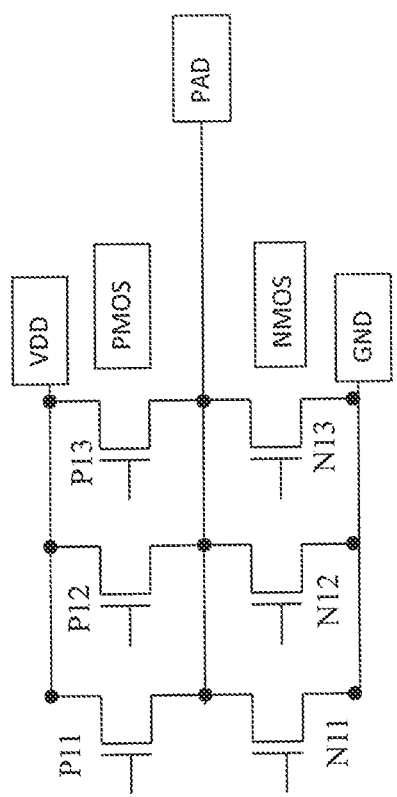
FIGS. 9A-9C illustrate illustrative embodiments of implementing the layout generation methodology described above for specific circuit examples.
Figure 9B:
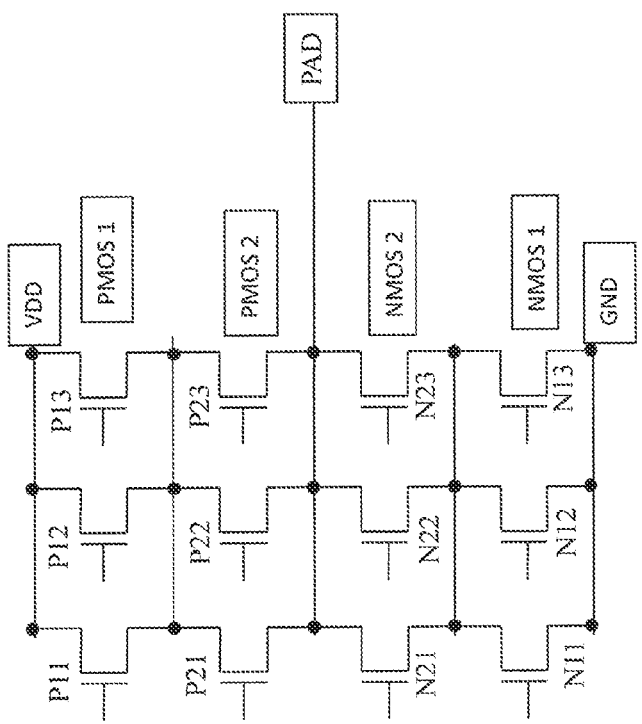
Figure 9C:
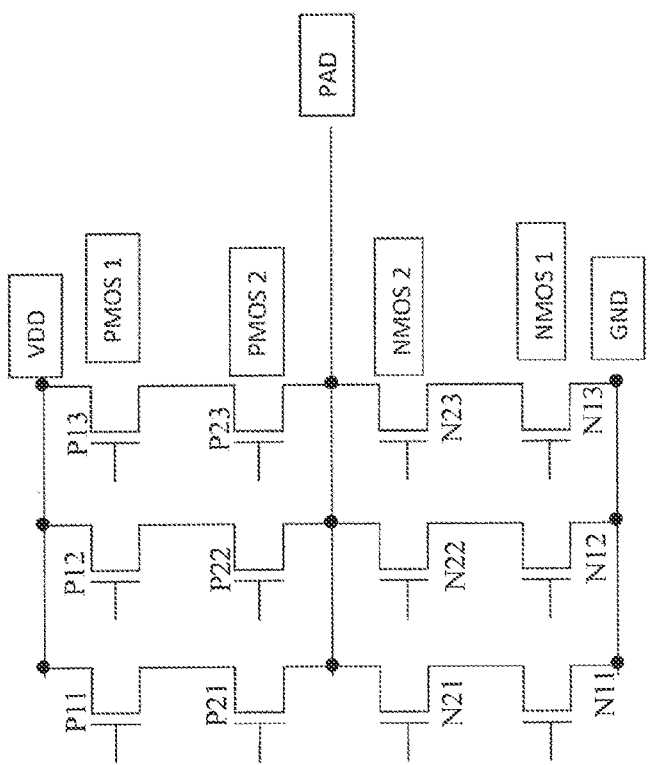

FIGS. 9A-9C illustrate illustrative embodiments of implementing the layout generation methodology described above for specific circuit examples.

FIG. 9A illustrates a driver circuit including a plurality of NMOS and PMOS transistors coupled between VDD and GND with an input pad (PAD). In this illustration, for clarity, the PMOS transistors are identified as P11, P12, and P13 while the NMOS transistors are illustrated as N11, N12, and N13. In this schematic illustration, the number of PMOS or NMOS transistor are connected are parallel or have the source/drain terminals coupled to a first common node (VDD or PAD) and have corresponding drain/source terminals coupled to a second common node (PAD or VDD). In this illustration, the PMOS master PCELL layout (referenced as PMOS) may include the transistors P11, P12, and P13 along with their corresponding guard rings. Similarly, the NMOS master PCELL layout (referenced as NMOS) may include the transistors N11, N12, and N13 along with their corresponding guard rings. Next, at each location, a child PCELL is generated as described in various embodiments previously. The same master PCELL layout as the child PCELL layout until a parameter is changed. In such an instance, the child PCELL layout is changed without changing any other child PCELL.

FIG. 9B illustrates an alternative circuit in accordance with another illustrative embodiment of the present invention.

Similar to the illustration of FIG. 9A, in this embodiment, all transistors in a row are coupled in parallel. However, unlike the prior embodiment, more than one PMOS transistor is serially connected in each column. Accordingly, in this embodiment, two PMOS master cell layout blocks may be generated. The first PMOS master PCELL (PMOS 1) includes transistors P11, P12, and P13 along with their corresponding guard rings. The second PMOS master PCELL (PMOS 2) includes transistors P21, P22, and P23 along with their corresponding guard rings. The transistor P11 is coupled to transistors P12 and P13 through a common node, which may be floating.

Similarly, two NMOS master cell layout blocks are generated. The first NMOS master cell (NMOS 1) includes transistors N11, N12, and N13 along with their corresponding guard rings. The second NMOS master cell includes transistors N21, N22, and N23 along with their corresponding guard rings (NMOS 2).

When generating the sequence in which the MOSFETs of this master PCELL are generated, the local connects of the MOSFETs have to be considered. In case of the examples of FIGS. 9A and 9B, each transistor in a row is coupled to all other transistors in the adjacent row. For example, in FIG. 9B, the PMOS transistor P11 is coupled to the PMOS transistors P21, P22, and P23. Therefore, there is no requirement that P11 and P21 have to abut each other. In such a case, the sequence is established depending on the finger width of the transistors.

Starting with the smallest width MOS, the MOS fingers are arranged in the ascending order and multiple numbers of fingers may be enclosed in between the guard ring. The number of fingers enclosed within a guard ring may be obtained from user input.

In case the same MOS fingers are placed in different guard rings, the metal connection is carefully located to connect their gates without shorting with the guard ring. However, embodiments of the present invention also include sequencing the transistors in a descending order by starting from the largest width MOSFET.

FIG. 9C illustrates an alternative circuit in accordance with another illustrative embodiment of the present invention.

Unlike the schematic of FIG. 9B, the transistors in each row are not connected to a common source or drain node. Rather, each column of transistors is coupled in parallel. In this case, two common terminals are defined and identified, for example, VDD and PAD or GND and PAD. All PMOS transistors connected to VDD are categorized into a first PMOS master PCELL (PMOS 1) while all PMOS transistors connected to PAD are categorized into a second PMOS master PCELL (PMOS 2). Similarly, all NMOS transistors connected to GND are categorized into a first NMOS master PCELL (NMOS 1) while all NMOS transistors connected to PAD are categorized into a second NMOS master PCELL (NMOS 2).

Similar to FIG. 9B, the first PMOS master PCELL includes transistors P11, P12, and P13 along with their corresponding guard rings. The second PMOS master PCELL includes transistors P21, P22, and P23 along with their corresponding guard rings. The first NMOS master PCELL includes transistors N11, N12, and N13 along with their corresponding guard rings. The second NMOS master PCELL includes transistors N21, N22, and N23 along with their corresponding guard rings.

In this case, every node of every PMOS and NMOS transistor in the first PMOS master PCELL (PMOS 1) and the first NMOS master PCELL (NMOS 1) are checked with every other node of every PMOS and NMOS in the second PMOS master PCELL (PMOS 2) and the second NMOS master PCELL (NMOS 2) identify which transistors are coupled to a particular transistor. This avoids changing the circuit during layout generation.

Thus, a sequence of transistors in the first PMOS and NMOS master PCELLs PMOS 1 and NMOS1 is established depending on the finger width. Starting with the smallest width MOS, the MOS fingers are arranged in the ascending order and the multiple numbers of fingers (e.g., as obtained from user input) are enclosed in between the guard ring. In case the same MOS fingers are placed in different guard rings, the metal connection are connected without their gates shorting with the guard ring. However, embodiments of the present invention also include sequencing the transistors in a descending order by starting from the largest width MOSFET.

Once the sequence of transistors in the first PMOS and NMOS master PCELLs PMOS 1 and NMOS1 is established, the sequence of the transistors in the second PMOS and NMOS master PCELLs PMOS 2 and NMOS 2 is predetermined. This is because, particular transistors in PMOS 2 and NMOS 2 are coupled to particular transistors in PMOS 1 and NMOS 1. Therefore, the sequence of the transistors in PMOS 2 and NMOS 2 is made to match the corresponding transistor to which it is coupled in PMOS 1 and NMOS 1. For example, if the sequence of the transistors in PMOS 1 is P12, P11, P13, then the sequence of transistors in PMOS 2 is P22, P21, and P23.

FIG. 10 illustrates a computer system implementing the embodiments of the present invention.

The system may include a processor 903 for performing the computations described above in various embodiments. The processor 903 may be coupled to other components through a central bus 909. For example, the system may receive communication through I/O ports 901 and may include a visual output through a display 905. The system may also receive inputs through peripherals 913 as well as through sensors 911 coupled to the system. The system may store contents before, during, and/or after processing in the processor 903 in the memory 915, which may include both read only memory (ROM) and random access memory (RAM). In various embodiments, the memory 915 may include dynamic memory and nonvolatile memory. In some embodiments, the system may also include a system management unit (SMU) 907 for managing the system, for example, powering the operations and/or providing timing functions for the system. Embodiments of the present invention may be implemented in hardware and/or software.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method comprising:
designing a layout of a driver of a semiconductor device by
analyzing a schematic circuit for the driver, the schematic circuit comprising PMOSFETs and NMOSFETs;
grouping PMOSFETs coupled between first common nodes into one or more first classes;
grouping NMOSFETs coupled between second common nodes into one or more second classes; and
generating a layout for each MOSFET at each location in a layout area of the layout of the driver by
generating a super parameterized cell (PCELL) layout block comprising a master MOSFET PCELL and a master guard ring PCELL for each of the first class and the second class, the master MOSFET PCELL comprising a first set of parameters for the MOSFET and the master guard ring PCELL comprising a second set of parameters for the guard ring around the MOSFET, wherein the first and the second parameters include all design rules relating to the layout of the driver, and instantiating a child PCELL of the master MOSFET PCELL and the master guard ring PCELL at each location in the layout area, the child PCELLs inheriting all the first and the second parameters and including layout cell location information.

2. The method of claim 1, wherein grouping PMOSFETs coupled in parallel between the first common nodes into one or more first classes comprises:
identifying components comprising PMOSFETs coupled in parallel between the first common nodes;
identifying serially coupled PMOSFETs in each of the components; and
grouping similarly coupled PMOSFETs in each component into a class of the one or more first classes.

3. The method of claim 2, wherein transistors coupled to the same node of the first common nodes are similarly coupled transistors in each component.

4. The method of claim 1, wherein grouping PMOSFETs coupled in parallel between the first common nodes into one or more first classes comprises grouping all PMOSFETs coupled in parallel between the first common nodes into a single first class.

5. The method of claim 1, wherein a node of the first common nodes is a floating node.

6. The method of claim 1, wherein grouping NMOSFETs coupled in parallel between two second common nodes into one or more second classes comprises:
identifying components comprising NMOSFETs coupled in parallel between the second common nodes;
identifying serially coupled NMOSFETs in each of the components; and
grouping similarly coupled NMOSFETs in each component into a class of the one or more second classes.

7. The method of claim 6, wherein NMOSFETs coupled to the same node of the second common nodes are similarly coupled NMOSFETs in each component.

8. The method of claim 1, wherein grouping NMOSFETs coupled in parallel between second common nodes into one or more second classes comprises grouping all NMOSFETs coupled in parallel between the second common nodes into a single second class.

9. The method of claim 1, wherein designing the layout further comprises generating a sequence in which the MOSFETs within each class of the first and the second classes are generated during layout generation, wherein generating the sequence comprises generating a sequence of PMOSFETs in accordance with ascending or descending order of widths in one class of the one or more first classes, wherein the PMOSFETs in the remaining classes of the one or more first classes are aligned to the PMOSFETs in the sequence of PMOSFETs.

10. The method of claim 1, wherein designing the layout further comprises generating a sequence in which the MOSFETs within each class of the first and the second classes will be generated during layout generation, wherein generating the sequence further comprises generating a sequence of NMOSFETs in accordance with ascending or descending order of widths in one class of the one or more second classes, wherein the NMOSFETs in the remaining classes of the one or more second classes are aligned to the NMOSFETs in the sequence of NMOSFETs.

11. The method of claim 1, wherein designing the layout further comprises generating a sequence in which the MOSFETs within each class of the first and the second classes will be generated during layout generation, wherein generating the sequence comprises generating a sequence of PMOSFETs in accordance with ascending or descending order of widths for each class of the one or more first classes.

12. The method of claim 1, wherein designing the layout further comprises generating a sequence in which the MOSFETs within each class of the first and the second classes will be generated during layout generation, wherein generating the sequence comprises generating a sequence of NMOSFETs in accordance with ascending or descending order of widths for each class of the one or more second classes.

13. The method of claim 1, wherein designing the layout further comprises calculating a finger width for all MOSFETs in each of the first class and the second class.

14. The method of claim 13, wherein calculating the finger width for all the MOSFETs comprises:
determining a number of PMOSFETs in the one or more first classes; and
if the number of PMOSFETs in the one or more first classes is not greater than one, dividing the finger widths of the PMOSFETs in the first class by at least two and correspondingly increasing a total number of fingers of the PMOSFETs so as to either double the total columns in a layout cell or to at least double the number of rows in the layout cell.

15. The method of claim 13, wherein calculating the finger width for all the MOSFETs comprises:
determining a number of PMOSFETs in the one or more first classes; and
if the number of PMOSFETs in the one or more first classes is greater than one, identifying the PMOSFET with the smallest width in each class of the one or more first classes, and reducing the widths of all other PMOSFETs to be similar to the smallest width PMOSFET in the one or more first classes and correspondingly increasing the total number of fingers.

16. The method of claim 13, wherein calculating the finger width for all the MOSFETs comprises:
determining a number of NMOSFETs in the one or more second classes; and
if the number of NMOSFETs in the one or more second classes is not greater than one, dividing the finger widths of the NMOSFETs in the second class by at least two and correspondingly increasing the total number of fingers of the NMOSFETs so as to either double the total columns in a layout cell or to increase the number of rows by at least twice in a layout cell.

17. The method of claim 13, wherein calculating the finger width for all the MOSFETs comprises:
determining a number of NMOSFETs in the one or more second classes; and
if the number of NMOSFETs in the one or more second classes is greater than one, identifying the NMOSFET with the smallest width in each class of the one or more second classes, and reducing the widths of all other NMOSFETs to be similar to the smallest width NMOSFET in the one or more first classes and correspondingly increasing the total number of fingers.

18. The method of claim 13, wherein the finger width is calculated to optimize an effective layout area for each class of the first and the second classes.

19. The method of claim 1, wherein designing the layout further comprises receiving number of fingers allowed in a guard ring and width of the guard ring for each class of the first and the second classes and incorporating the number of fingers during the generation of the master MOSFET PCELL and the master guard ring PCELL.

20. The method of claim 1, wherein designing the layout further comprises:

generating a router PCELL for all contacts to source and drain terminals of the MOSFETs, wherein the router PCELL includes parameters for metal layers above the MOSFETs and for the contacts to the source and drain terminals.

21. The method of claim 20, wherein the parameters for the metal layers include parameters to comply with electro-migration.

22. The method of claim 1, wherein designing the layout further comprises:
receiving an updated parameter for a child PCELL; and
modifying the child PCELL for each location in the layout area without modifying the master PCELL and any other child PCELL.

23. The method of claim 1, wherein the design rules comprise layout rules for electro static discharge protection and electro-migration protection, abutment rules, and design for manufacturability rules for MOSFETs and guard ring.

24. The method of claim 1, wherein the driver is an input/out (IO) pad driver.

25. The method of claim 1, wherein the driver comprises a ballast MOS of a regulator, grounded-gate NMOS (GGNMOS), grounded gate bidirectional NMOS (GGNBIMOS), MOS clamp of a ESD protection device connected between any two input/output terminals.

26. A method comprising:
designing a layout of a driver of a semiconductor device by
analyzing a schematic circuit for the driver, the schematic circuit comprising PMOSFETs and NMOSFETs;
grouping MOSFETs coupled between first common nodes into one or more classes;
calculating a finger width for all MOSFETs in the one or more classes;
generating a sequence in which the MOSFETs within each class of the one or more classes will be generated during layout generation;
receiving number of fingers allowed in a guard ring and guard ring width for each class of the one or more classes; and
generating the layout of the driver by
generating a super parameterized cell (PCELL) layout block comprising a master MOSFET PCELL and a master guard ring PCELL for each class, the master MOSFET PCELL comprising a first set of parameters for the MOSFET and the master guard ring PCELL comprising a second set of parameters for the guard ring around the MOSFET, wherein the first and the second parameters include all design rules relating to the layout of the circuit for the driver, and
instantiating a child PCELL of the master MOSFET PCELL and the master guard ring PCELL at each location in a layout area of the driver, the child PCELLs inheriting all the first and the second parameters and including layout cell location information.

27. The method of claim 26, wherein the finger width is calculated to optimize an effective layout area of the class of the one or more classes.

28. The method of claim 26, wherein source nodes of all MOSFETs in a class of the one or more classes are coupled to a common node and wherein drain nodes of all the MOSFETs in the class of the one or more classes are coupled to another common node.

29. The method of claim 26, wherein designing the layout further comprises:

generating a router PCELL for all contacts to source and drain terminals of the MOSFETs, wherein the router PCELL includes parameters for metal layers above the MOSFETs and for the contacts to the source and drain terminals.

30. The method of claim 29, wherein the parameters for the metal layers include parameters to comply with electro-migration.

31. The method of claim 26, wherein designing the layout further comprises:
receiving an updated parameter for a child PCELL; and
modifying the child PCELL for each location in the layout area without modifying the master PCELL and any other child PCELL.

32. The method of claim 26, wherein the design rules comprise layout rules for electro static discharge protection and electro-migration protection, abutment rules, design for manufacturability rules for MOSFETs and guard ring.

33. The method of claim 26, wherein the driver is an input/out (IO) pad driver.

34. The method of claim 26, wherein the driver comprises a ballast MOS of a regulator, grounded-gate NMOS (GGNMOS), grounded gate bidirectional NMOS (GGNBIMOS), or MOS clamp of a ESD protection device connected between any two input/output terminals.

35. The method of claim 26, wherein calculating a finger width for all MOSFETs comprises:
storing the product of a number of fingers and multiplicity of all the MOSFETs in each class of the one or more classes in a first list;
storing the finger width of all the MOSFETs in each class in a second list;
determining a number of MOSFETs in each class;
if the number of MOSFETs in a class is not greater than one, dividing the finger widths of the MOSFETs in the class by at least two and correspondingly increasing the number of fingers of the MOSFETs so as to either double the total columns or to at least double the number of rows in the layout cell; and
if the number of MOSFETs in a class is greater than one, identifying the MOSFET with the smallest width in that class, and reducing the widths of all MOSFETs to be similar to the smallest width MOSFET in the class and correspondingly increasing the number of fingers.

36. The method of claim 35, wherein designing the layout further comprises:
sorting the second list according to ascending or descending finger width; and
updating the first list to correspond to the sorted second list.

37. A non-transitory computer-readable storage medium with an executable program stored thereon, wherein the program instructs a microprocessor to perform the following steps:
analyzing a schematic circuit for a driver of a semiconductor device, the schematic circuit comprising PMOSFETs and NMOSFETs;
grouping PMOSFETs coupled between first common nodes into one or more first classes;
grouping NMOSFETs coupled between second common nodes into one or more second classes; and
generating a layout for each MOSFET at each location in a layout area of the layout of the driver by
generating a super parameterized cell (PCELL) layout block comprising a master MOSFET and a master guard ring PCELL for each of the first class and the second class, the master MOSFET PCELL comprising a first set of parameters for the MOSFET and the master guard ring PCELL comprising a second set of parameters for the guard ring around the MOSFET, wherein the first and the second parameters include all design rules relating to the layout of the driver, and instantiating a child PCELL of the master MOSFET PCELL and the master guard ring PCELL at each location in the layout area, the child PCELLs inheriting all the first and the second parameters and including layout cell location information.

38. A method of forming a semiconductor device, the method comprising:

generating a layout for a input/output (IO) driver of the semiconductor device by using a computerized method comprising:

analyzing a schematic circuit for the IO driver, the schematic circuit comprising PMOSFETs and NMOSFETs;

grouping PMOSFETs coupled between first common nodes into one or more first classes;

grouping NMOSFETs coupled between second common nodes into one or more second classes; and generating a layout for each MOSFET at each location in a layout area of the layout of the I/O driver by generating a super parameterized cell (PCELL) layout block comprising a master MOSFET PCELL and a master guard ring PCELL for each of the first class and the second class, the master MOSFET PCELL comprising a first set of parameters for the MOSFET and the master guard ring PCELL comprising a second set of parameters for the guard ring around the MOSFET, wherein the first and the second parameters include all design rules relating to the layout of the driver, and instantiating a child PCELL of the master MOSFET PCELL and the master guard ring PCELL at each location in the layout area, the child PCELLs inheriting all the first and the second parameters and including layout cell location information;

fabricating a mask based on the generated layout; and forming the semiconductor device using the mask.

39. A method of forming a semiconductor device, the method comprising:

manufacturing the semiconductor device using a mask including a layout of a driver of the semiconductor device, wherein the layout has been generated by analyzing a schematic circuit for the driver of the semiconductor device, the schematic circuit comprising PMOSFETs and NMOSFETs;

grouping PMOSFETs coupled between first common nodes into one or more first classes;

grouping NMOSFETs coupled between second common nodes into one or more second classes; and generating a layout for each MOSFET at each location in a layout area of the layout of the driver by generating a super parameterized cell (PCELL) layout block comprising a master MOSFET PCELL and a master guard ring PCELL for each of the first class and the second class, the master MOSFET PCELL comprising a first set of parameters for the MOSFET and the master guard ring PCELL comprising a second set of parameters for the guard ring around the MOSFET, wherein the first and the second parameters include all design rules relating to the layout of the driver, and instantiating a child PCELL of the master MOSFET PCELL and the master guard ring PCELL at each location in the layout area, the child PCELLs inheriting all the first and the second parameters and including layout cell location information.

* * * * *